United States Patent
Sugawara

(10) Patent No.: US 9,799,772 B2
(45) Date of Patent: Oct. 24, 2017

(54) THIN FILM TRANSISTOR DEVICE, METHOD FOR MANUFACTURING SAME AND DISPLAY DEVICE

(71) Applicant: JOLED INC., Tokyo (JP)

(72) Inventor: Yuta Sugawara, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/894,027

(22) PCT Filed: Apr. 3, 2014

(86) PCT No.: PCT/JP2014/001929
§ 371 (c)(1),
(2) Date: Nov. 25, 2015

(87) PCT Pub. No.: WO2014/192210
PCT Pub. Date: Dec. 4, 2014

(65) Prior Publication Data
US 2016/0093744 A1    Mar. 31, 2016

(30) Foreign Application Priority Data

May 29, 2013   (JP) ................................. 2013-112741

(51) Int. Cl.
*H01L 29/49*    (2006.01)
*H01L 29/786*   (2006.01)
(Continued)

(52) U.S. Cl.
CPC .... *H01L 29/78606* (2013.01); *H01L 27/1225* (2013.01); *H01L 29/7869* (2013.01); *H01L 29/66969* (2013.01)

(58) Field of Classification Search
CPC ........... H01L 29/78606; H01L 27/1225; H01L 29/66969
See application file for complete search history.

(56) References Cited

U.S. PATENT DOCUMENTS 5,443,922 A     8/1995   Nishizaki et al.
8,389,989 B2 *  3/2013   Yamazaki ........... H01L 27/1225
                                                    257/258
(Continued)

FOREIGN PATENT DOCUMENTS

JP     05-163488      6/1993
JP     2004-056099    2/2004
(Continued)

OTHER PUBLICATIONS

U.S. Appl. No. 14/894,148 to Yuta Sugawara, which was filed Nov. 25, 2015.
(Continued)

*Primary Examiner* — Michael Shingleton
(74) *Attorney, Agent, or Firm* — Greenblum & Bernstein, P.L.C.

(57) ABSTRACT

A TFT device including: a gate electrode; a channel layer above the gate electrode; a channel protection layer on the channel layer; an electrode pair on the channel protection layer composed of a source electrode and a drain electrode that are spaced away from one another, a part of each of the source electrode and the drain electrode in contact with the channel layer through the channel protection layer; and a passivation layer extending over the gate electrode, the channel layer, the electrode pair, and the channel protection layer. The channel layer is made of an oxide semiconductor. The TFT device has a first sub-layer made of one of silicon nitride and silicon oxynitride and in which Si—H density is no greater than $2.3 \times 10^{21}$ cm$^{-3}$. The first sub-layer is included in at least one of the channel protection layer and the passivation layer.

10 Claims, 23 Drawing Sheets

| | | Sample type 21 | Sample type 22 | Sample type 23 | Sample type 24 |
|---|---|---|---|---|---|
| Film forming conditions | Temperature [°C] | 300 | 300 | 300 | 300 |
| | Power [W] | 100 | 180 | 100 | 100 |
| | Pressure [torr] | 3 | 3 | 4 | 1.5 |
| | N$_2$O [sccm] | 1200 | 1500 | 1200 | 1200 |
| | SiH$_4$ [sccm] | 16 | 20 | 16 | 16 |
| | Distance between electrodes [mils] | 550 | 550 | 550 | 550 |

(51) Int. Cl.
  *H01L 27/12*  (2006.01)
  *H01L 29/66*  (2006.01)

(56) References Cited

U.S. PATENT DOCUMENTS

| | | | | |
|---|---|---|---|---|
| 8,890,145 | B2* | 11/2014 | Lin | H01L 29/78606 257/43 |
| 9,153,601 | B2* | 10/2015 | Chen | H01L 29/7869 |
| 9,224,871 | B2* | 12/2015 | Maeda | H01L 29/78696 |
| 2004/0099915 | A1 | 5/2004 | Takayama et al. | |
| 2005/0106898 | A1 | 5/2005 | Takayama et al. | |
| 2007/0072439 | A1 | 3/2007 | Akimoto et al. | |
| 2008/0142887 | A1 | 6/2008 | Takayama et al. | |
| 2010/0051936 | A1 | 3/2010 | Hayashi et al. | |
| 2011/0068336 | A1 | 3/2011 | Yamazaki et al. | |
| 2011/0095292 | A1 | 4/2011 | Takayama et al. | |
| 2011/0140116 | A1* | 6/2011 | Morosawa | H01L 29/4908 257/59 |
| 2012/0119212 | A1 | 5/2012 | Endo et al. | |
| 2012/0168750 | A1 | 7/2012 | Hayashi et al. | |
| 2012/0181533 | A1* | 7/2012 | Yoo | H01L 27/1248 257/43 |
| 2013/0075719 | A1* | 3/2013 | Nakano | H01L 29/7869 257/43 |
| 2013/0120692 | A1* | 5/2013 | Nishi | G02F 1/13743 349/96 |
| 2014/0113407 | A1 | 4/2014 | Yamazaki et al. | |
| 2014/0138675 | A1* | 5/2014 | Yamazaki | H01L 29/66757 257/43 |
| 2014/0342498 | A1 | 11/2014 | Endo et al. | |
| 2015/0035058 | A1 | 2/2015 | Takayama et al. | |
| 2015/0084042 | A1* | 3/2015 | Maeda | H01L 29/78696 257/43 |
| 2015/0084048 | A1 | 3/2015 | Hayashi et al. | |
| 2015/0171220 | A1* | 6/2015 | Tomiyasu | H01L 29/7869 257/43 |
| 2015/0200113 | A1* | 7/2015 | Kishida | H01L 21/477 438/104 |
| 2015/0221677 | A1* | 8/2015 | Okabe | G02F 1/1368 349/43 |
| 2016/0079437 | A1* | 3/2016 | Ochi | H01L 29/7869 257/43 |
| 2016/0118244 | A1* | 4/2016 | Hayashi | H01L 29/4908 257/43 |
| 2016/0133650 | A1* | 5/2016 | Sugawara | H01L 29/7869 257/40 |
| 2016/0204266 | A1* | 7/2016 | Seo | H01L 29/7869 257/43 |
| 2016/0218000 | A1* | 7/2016 | Choi | H01L 21/0234 |
| 2016/0240565 | A1* | 8/2016 | Kim | H01L 27/1251 |

FOREIGN PATENT DOCUMENTS

| | | |
|---|---|---|
| JP | 2007-123861 | 5/2007 |
| JP | 2008-166716 | 7/2008 |
| JP | 2011-091381 | 5/2011 |
| JP | 2012-104639 | 5/2012 |
| JP | 2012-119667 | 6/2012 |

OTHER PUBLICATIONS

International Search Report (ISR) from International Searching Authority (Japan Patent Office) in International Pat. Appl. No. PCT/JP2014/001929, dated Jul. 1, 2014.

* cited by examiner

FIG. 9A
|  | | Sample type 1 | Sample type 2 |
|---|---|---|---|
| Film forming conditions | Temperature [°C] | 350 | 350 |
| | Power [W] | 150 | 150 |
| | Pressure [torr] | 3 | 1.5 |
| | $NH_3$ [sccm] | 100 | 50 |
| | $N_2$ [sccm] | 2000 | 1000 |
| | $SiH_4$ [sccm] | 30 | 15 |
| | Distance between electrodes [mils] | 550 | 350 |
| Density | N-H [E22/$cm^3$] | 1.37 | 1.46 |
| | Si-H [E22/$cm^3$] | 0.35 | 0.13 |
| | Total [E22/$cm^3$] | 1.73 | 1.59 |
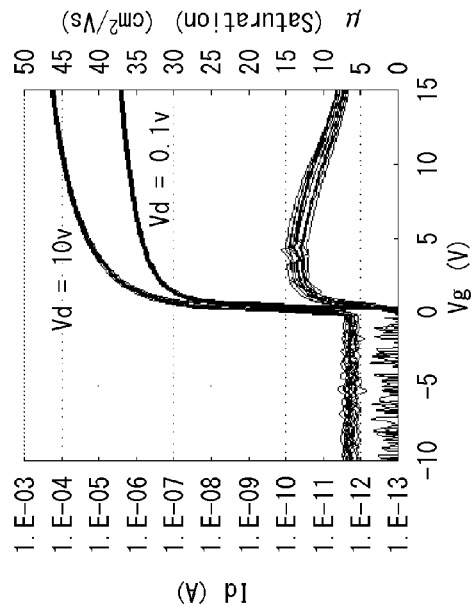
FIG. 9C Sample type 2
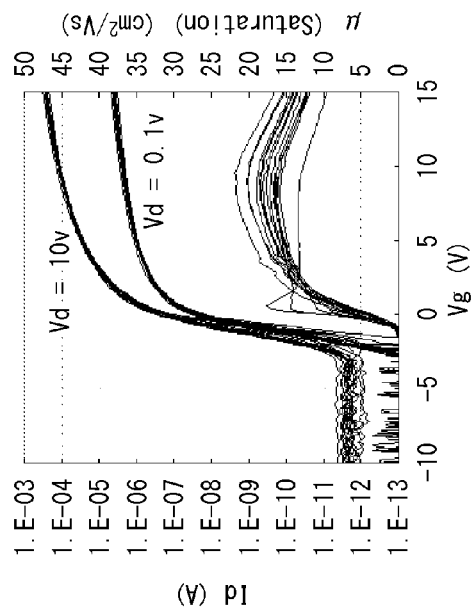
FIG. 9B Sample type 1

|  |  | Sample type 11 | Sample type 12 | Sample type 13 |
|---|---|---|---|---|
| Film forming conditions | Temperature [°C] | 245 | 245 | 245 |
|  | Power [W] | 150 | 150 | 150 |
|  | Pressure [torr] | 3 | 1.5 | 1.5 |
|  | NH$_3$ [sccm] | 100 | 50 | 50 |
|  | Ar [sccm] | 0 | 1220 | 0 |
|  | N$_2$O [sccm] | 1800 | 1000 | 1800 |
|  | SiH$_4$ [sccm] | 20 | 20 | 80 |
|  | Distance between electrodes [mils] | 550 | 550 | 550 |

FIG. 13A
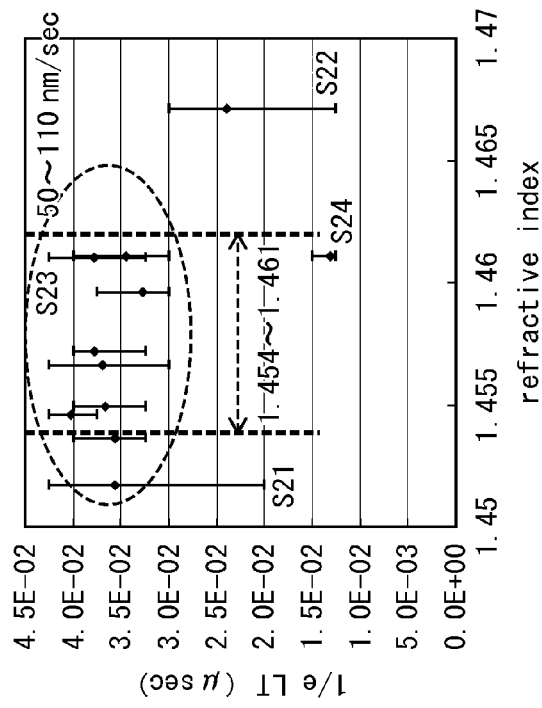
FIG. 13B
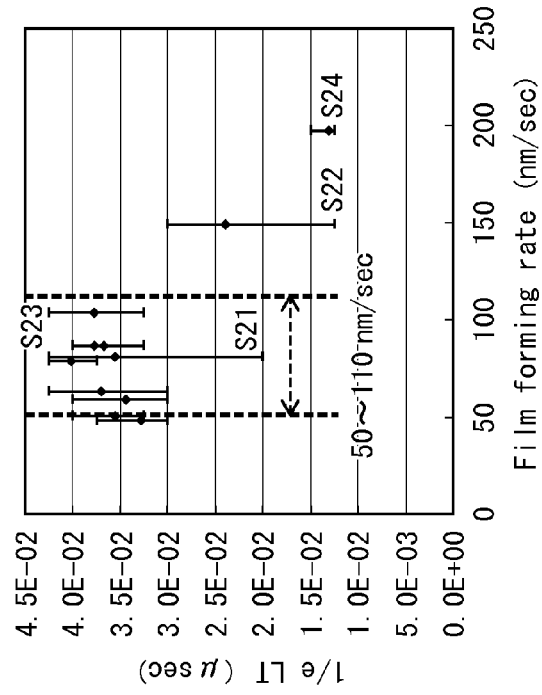
FIG. 13C

THIN FILM TRANSISTOR DEVICE, METHOD FOR MANUFACTURING SAME AND DISPLAY DEVICE

TECHNICAL FIELD

The present invention relates to a thin film transistor device, a manufacturing method of the thin film transistor device, and a display device. In particular, the present invention relates to characteristics of a channel protection layer, a passivation layer, and the like, in a thin film transistor device.

BACKGROUND ART

An active-matrix-type display device typically includes a TFT device that has a plurality of thin film transistor (TFT) elements, for achieving driving and light emission in units of sub-pixels. In connection with this, recently, TFT devices with a channel layer made of an oxide semiconductor are in development, for use in display devices and the like (refer to Patent Literature 1). The following describes a conventional TFT device with a channel layer made of an oxide semiconductor, with reference to FIG. 23.

The conventional TFT device illustrated in FIG. 23 includes a substrate 1900. Further, the conventional TFT device includes, disposed above the substrate one on top of another in the stated order: a gate electrode 1901; a gate insulating film 1903; a channel layer 1904; a protection film 1912; a drain electrode 1907; and a source electrode 1908. The channel layer 1904 is a layer of an oxide semiconductor including at least one of In, Zn, and Sn.

The protection film 1912 is made of an amorphous oxide semiconductor (e.g., amorphous SiO), and is in contact with the channel layer 1904. Further, the protection layer 1912 in this conventional TFT device is defined such that, when thermal desorption measurement is performed with respect to the protection layer 1912, oxygen of at least $3.8 \times 10^{19}$ $cm^{-3}$ is observed as desorption gas.

The conventional TFT device illustrated in FIG. 23, due to including the protection film 1912 whose film characteristic is defined as such, suppresses the generation of oxygen defects in the channel layer 1904 made of an oxide semiconductor, and thus suppresses an increase in off current deriving from generation of a large number of carrier electrons that would otherwise occur. Thus, this conventional TFT device has desirable characteristics with an excellent on/off ratio.

CITATION LIST

Patent Literature

[Patent Literature 1]
Japanese Patent Application Publication No. 2008-166716

SUMMARY OF INVENTION

Technical Problem

Meanwhile, there is a demand for improving the stability and reliability of TFT devices including a channel layer made of an oxide semiconductor. Thus, further research and development of such TFT devices are yet to be conducted.

The present invention aims to provide a solution to this situation, and aims to provide a thin film transistor device with high stability and reliability having a channel layer made of an oxide semiconductor, a method of manufacturing such a thin film transistor device, and a display device provided with such a thin film transistor device.

Means for Solving Problem

One aspect of the present disclosure is a TFT device including (i) a substrate, (ii) a gate electrode, (iii) a channel layer, (iv) a channel protection layer, (v) an electrode pair composed of a source electrode and a drain electrode, and (vi) a passivation layer.

The gate electrode is above the substrate.

The channel layer is above the gate electrode.

The channel protection layer is on the channel layer.

The electrode pair is on the channel protection layer, with the source electrode and the drain electrode spaced away from one another. A part of each of the source electrode and the drain electrode is in contact with the channel layer through the channel protection layer.

The passivation layer extends over the gate electrode, the channel layer, the electrode pair, and the channel protection layer.

In the TFT device pertaining to one aspect of the present disclosure, the channel layer is made of an oxide semiconductor, and the thin film transistor device has a first sub-layer which is made of one of silicon nitride and silicon oxynitride and in which a density of H atoms bonded with Si atoms is no greater than $2.3 \times 10^{21}$ $cm^{-3}$, the first sub-layer included in at least one of the channel protection layer and the passivation layer.

Advantageous Effects of Invention

The TFT device pertaining to one aspect of the present disclosure suppresses the influence of active hydrogen species generated during processing and after film forming. Thus, the TFT device pertaining to one aspect of the present invention has high stability and reliability.

Each of FIGS. 4A through 4D is a schematic cross-sectional diagram illustrating a process in the manufacturing of the display panel 10.

Each of FIGS. 5A through 5D is a schematic cross-sectional diagram illustrating a process in the manufacturing of the display panel 10.

Figure 6A:
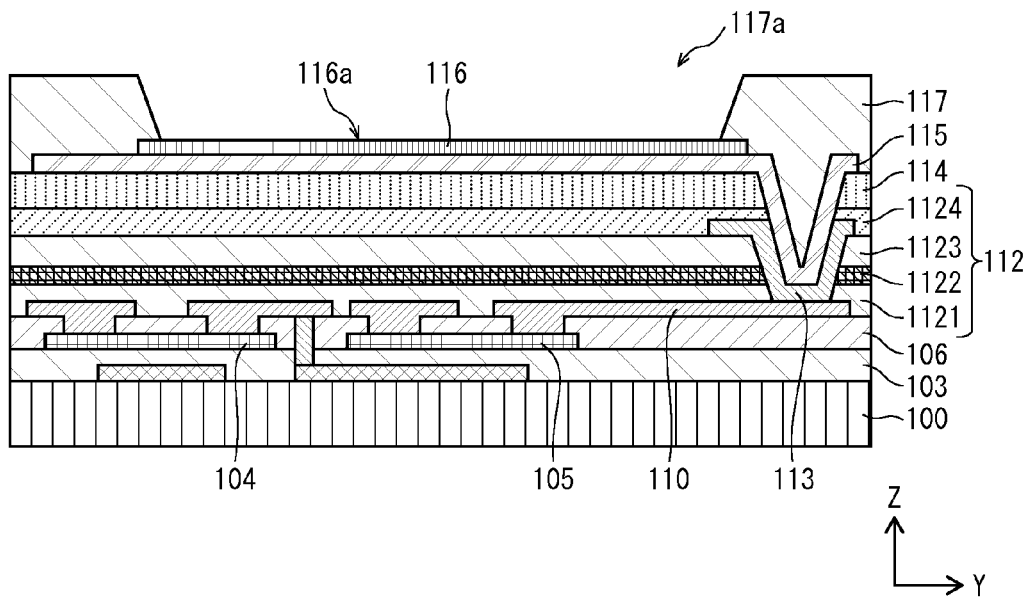
Figure 6B:
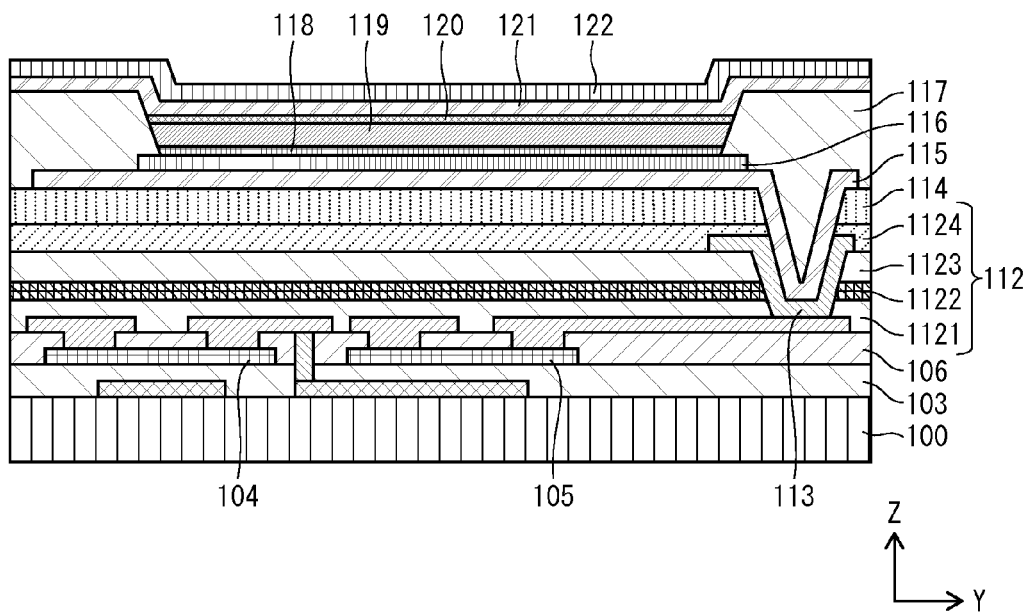

Each of FIGS. 6A and 6B is a schematic cross-sectional diagram illustrating a process in the manufacturing of the display panel 10.

Figure 7A:
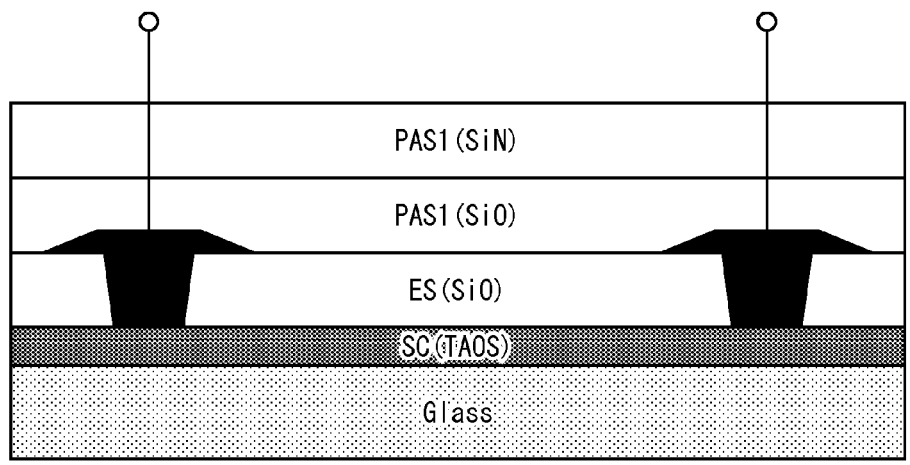
Figure 7B:
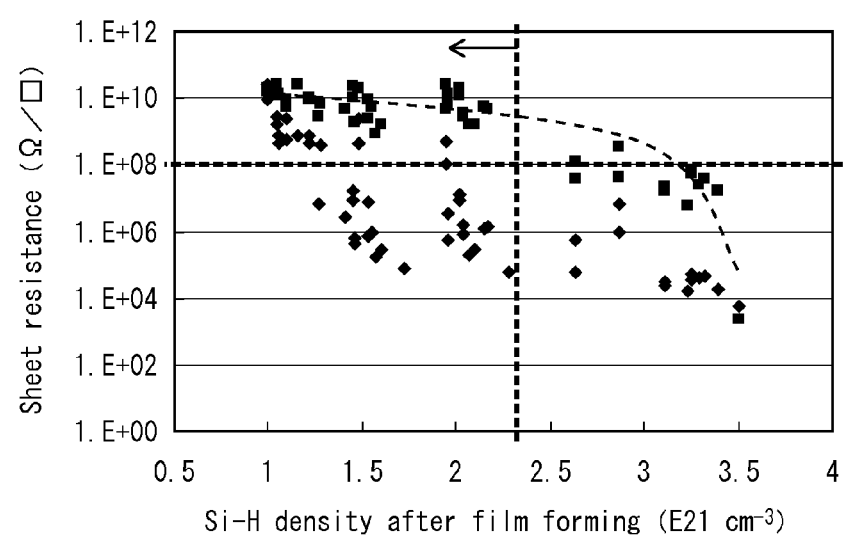

FIG. 7A is a schematic illustrating the structure of TEG samples for assessing resistance, and FIG. 7B is a characteristics diagram illustrating the relation between Si—H density in a SiN layer and sheet resistance of TAOS.

Figure 8:
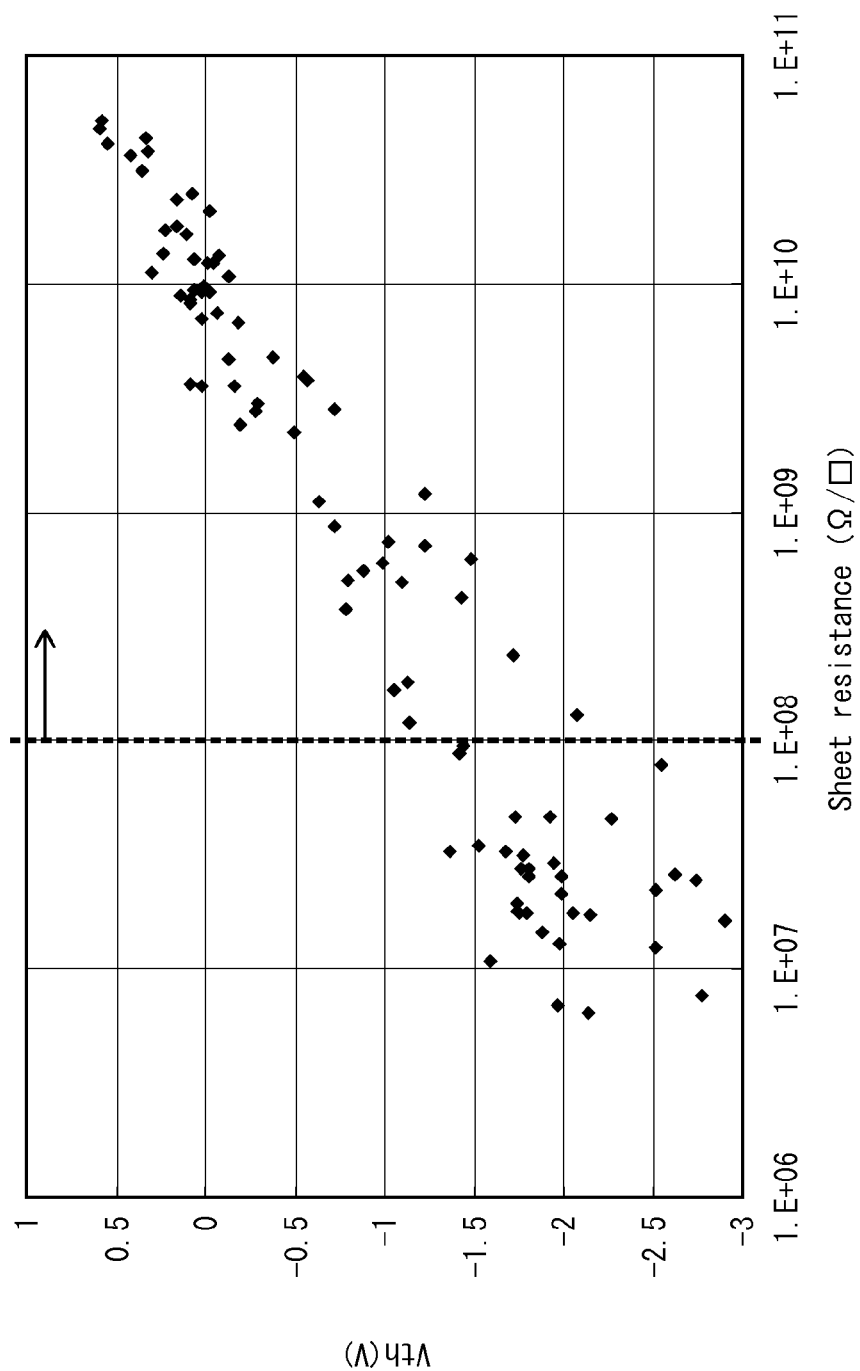

FIG. 8 is a characteristics diagram illustrating the relation between sheet resistance of TAOS and threshold voltage Vth.

FIG. 9A is a table illustrating the relation between film forming conditions of SiN layers and hydrogen density, FIG. 9B is a characteristics diagram illustrating Vg-Id characteristics of sample type 1, and FIG. 9C is a characteristics diagram illustrating Vg-Id characteristics of sample type 2.

Figures 10A, 10B:
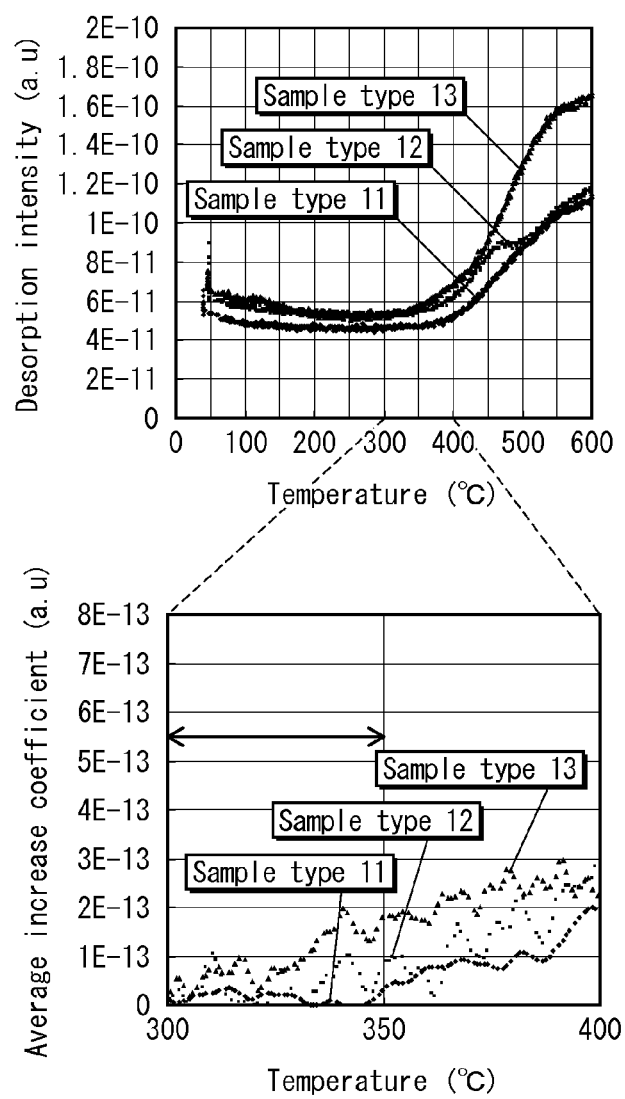

FIG. 10A is a table illustrating film forming conditions of SiO layers, and FIG. 10B is a characteristic diagram illustrating spectrums of hydrogen released from the SiO layers in thermal desorption measurement.

Figure 11A:
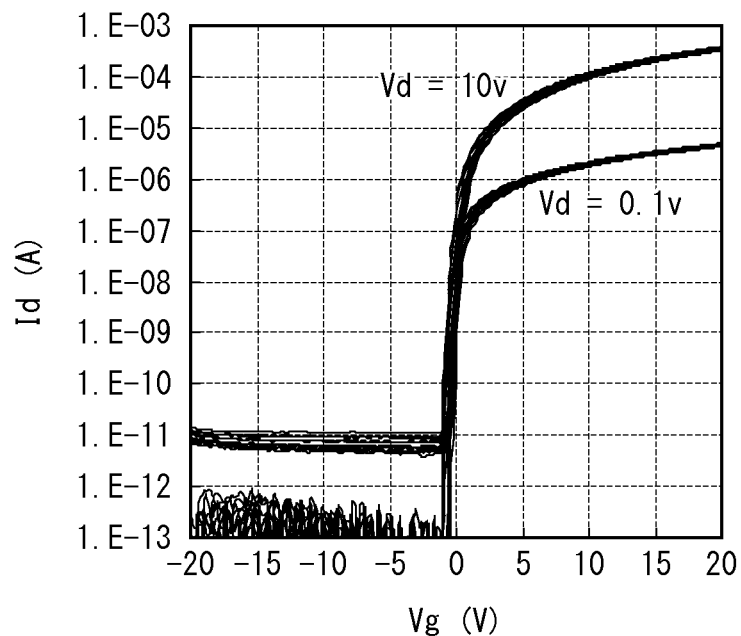
Figure 11B:
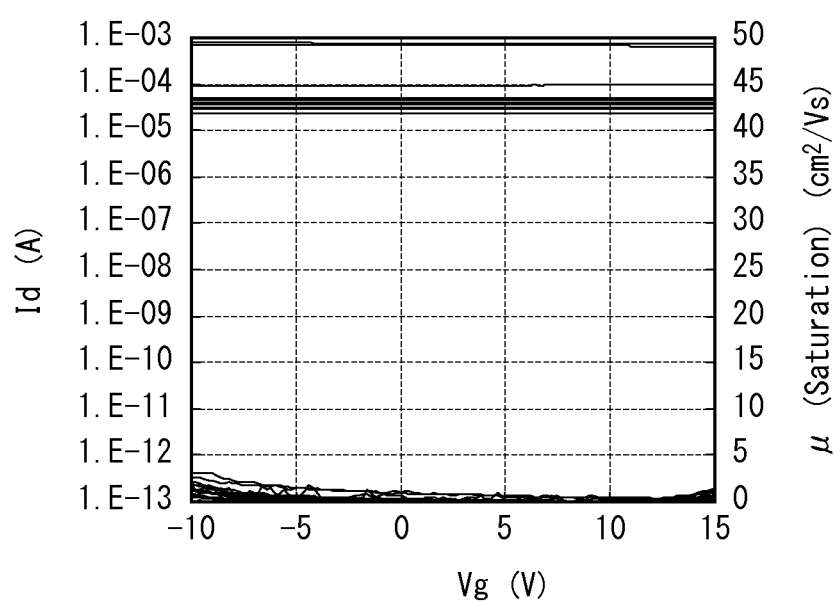

FIG. 11A is a characteristic diagram illustrating Vg-Id characteristics of sample types 11 and 12, and FIG. 11B is a characteristic diagram illustrating Vg-Id characteristics of sample type 13.

Figure 12A:
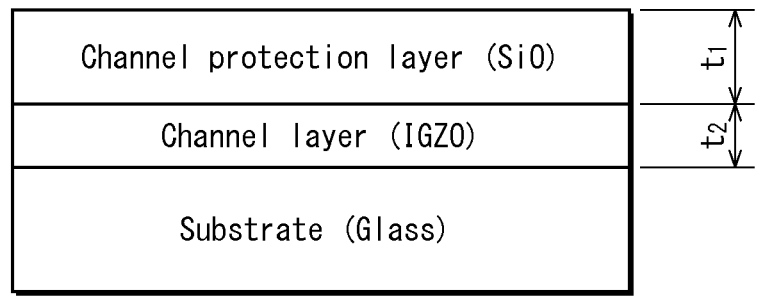
Figure 12B:
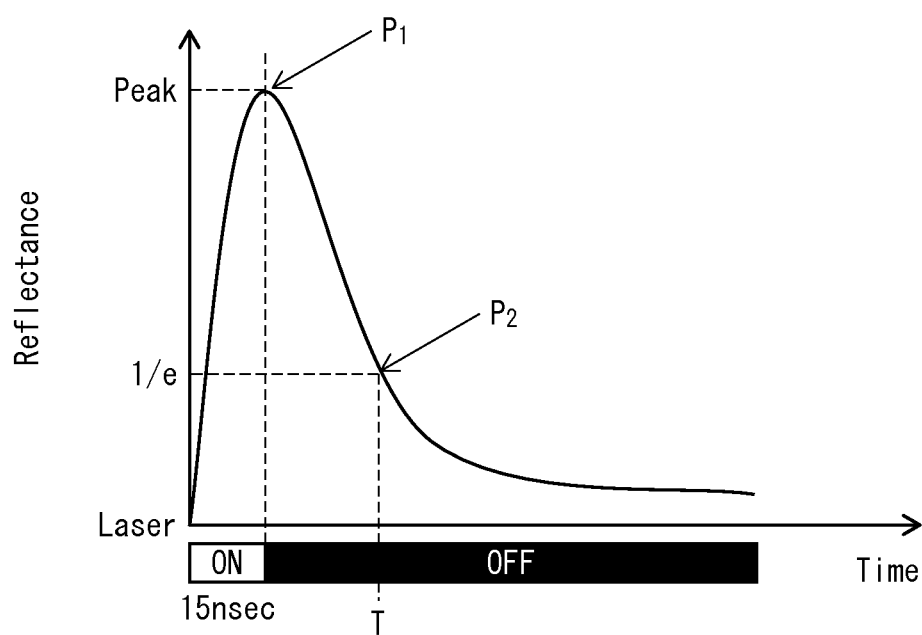

FIG. 12A is a schematic illustrating the structure of samples for measuring TAOS carrier lifetime, and FIG. 12B is a schematic illustrating how TAOS lifetime was measured.

FIG. 13A is a table illustrating film forming conditions of SiO layer, FIG. 13B is a characteristics diagram illustrating the relation between film forming rate and carrier lifetime, and FIG. 13C is a characteristic diagram illustrating the relation between refraction index and carrier lifetime.

Figure 14A:
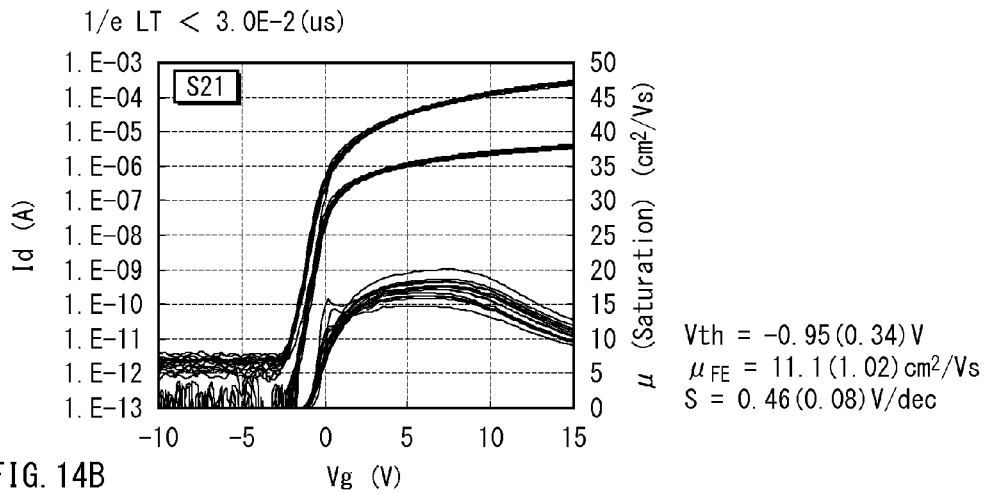
Figure 14B:
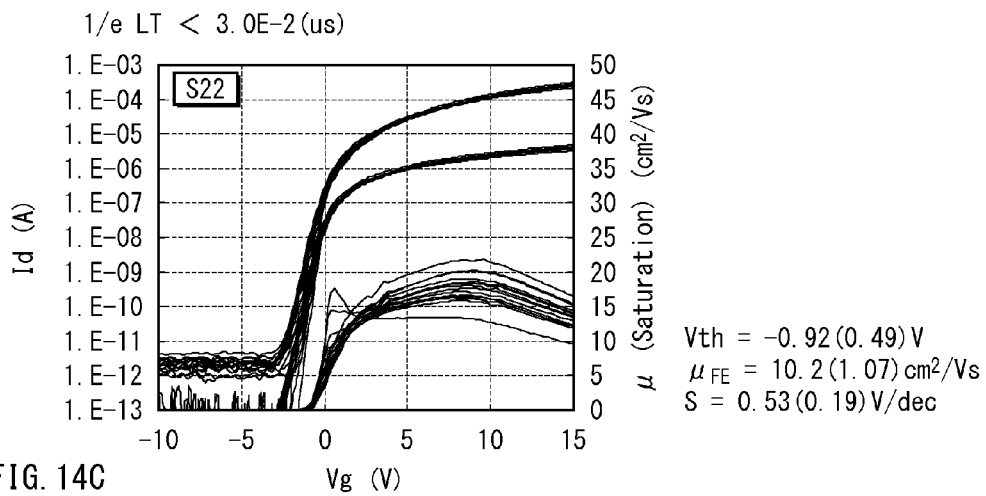
Figure 14C:
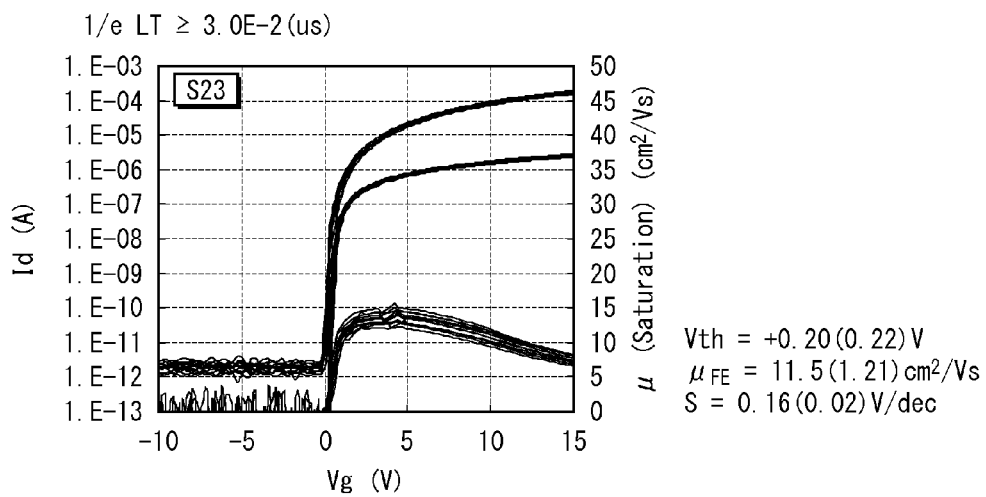

FIG. 14A is a characteristic diagram illustrating Vg-Id characteristics of sample type 21, FIG. 14B is a characteristic diagram illustrating Vg-Id characteristics of sample type 22, and FIG. 14C is a characteristic diagram illustrating Vg-Id characteristics of sample type 23.

Figure 15A:
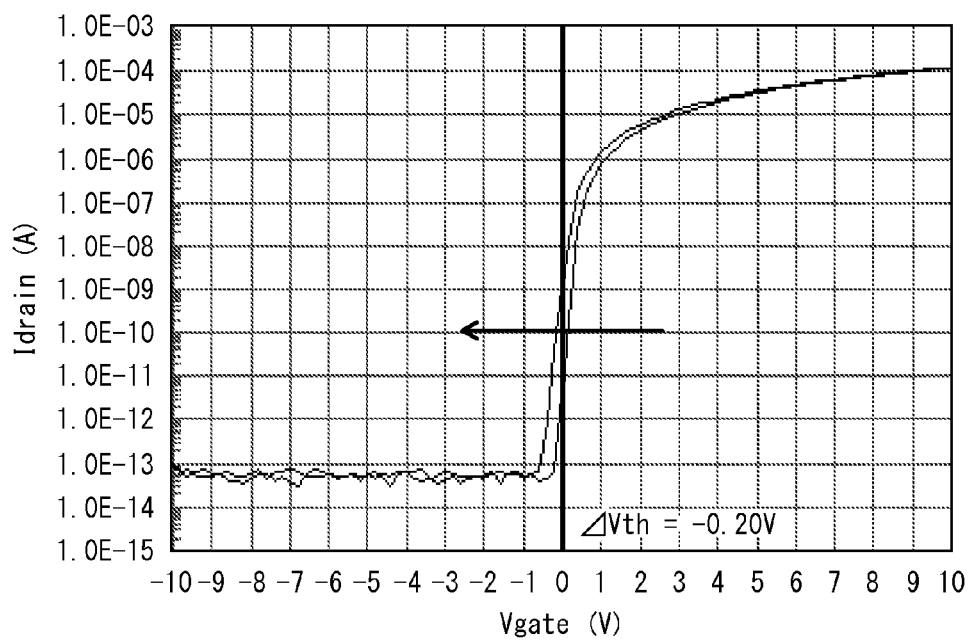
Figure 15B:
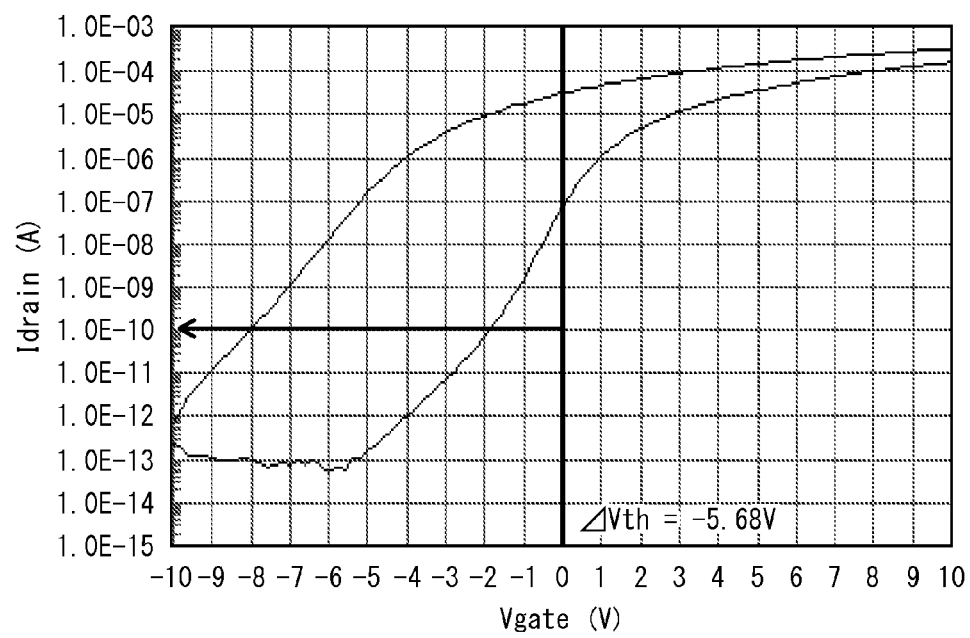

FIG. 15A is a characteristic diagram illustrating Vg-Id characteristics of a TFT pertaining to an embodiment, and FIG. 15B is a characteristic diagram illustrating Vg-Id characteristics of a TFT pertaining to a comparative example.

Figure 16:
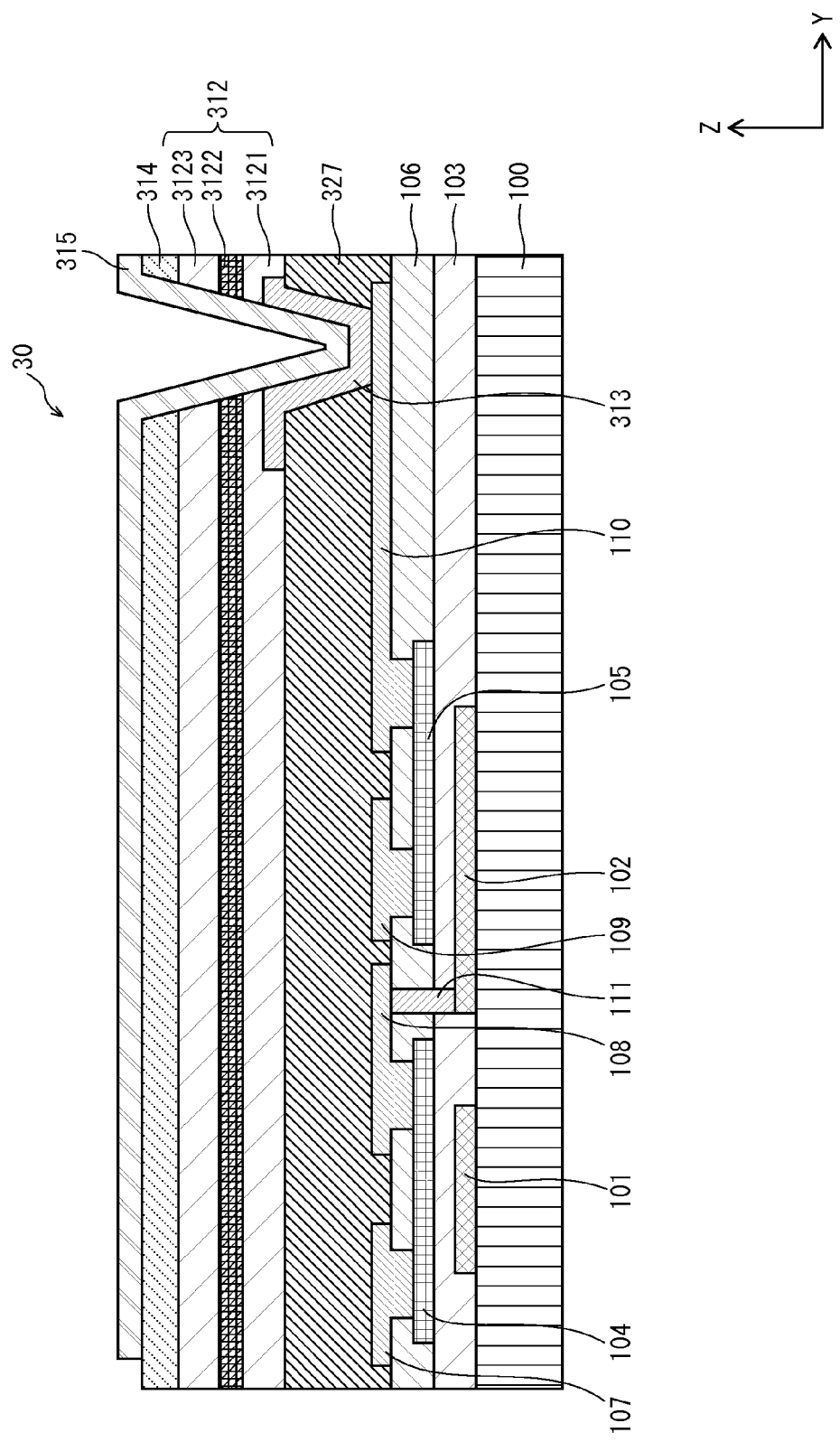

FIG. 16 is a schematic cross-sectional diagram illustrating the structure of one part of a display panel 30 pertaining to embodiment 2 of the present disclosure.

Figure 17:
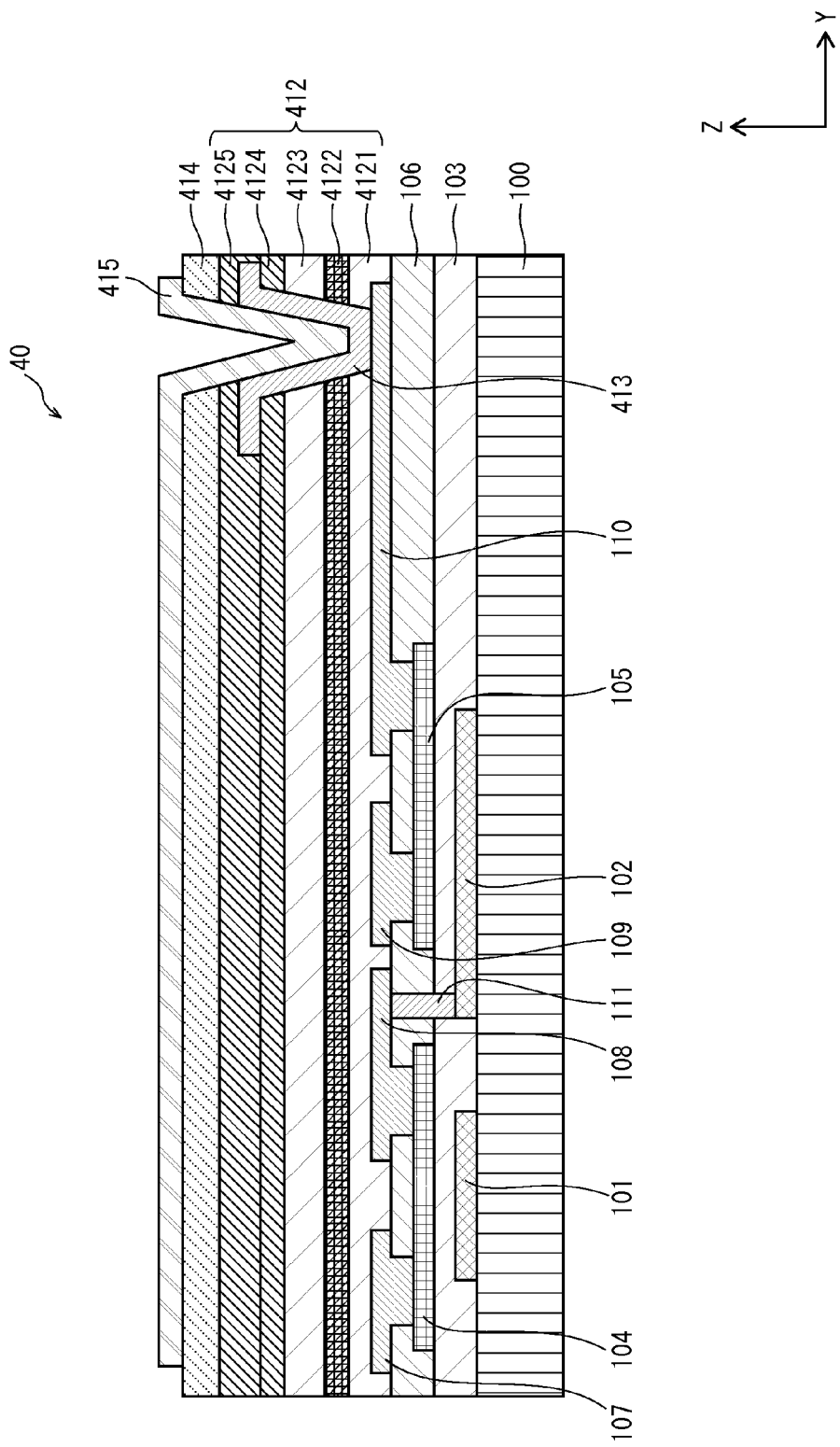

FIG. 17 is a schematic cross-sectional diagram illustrating the structure of one part of a display panel 40 pertaining to embodiment 3 of the present disclosure.

Figure 18:
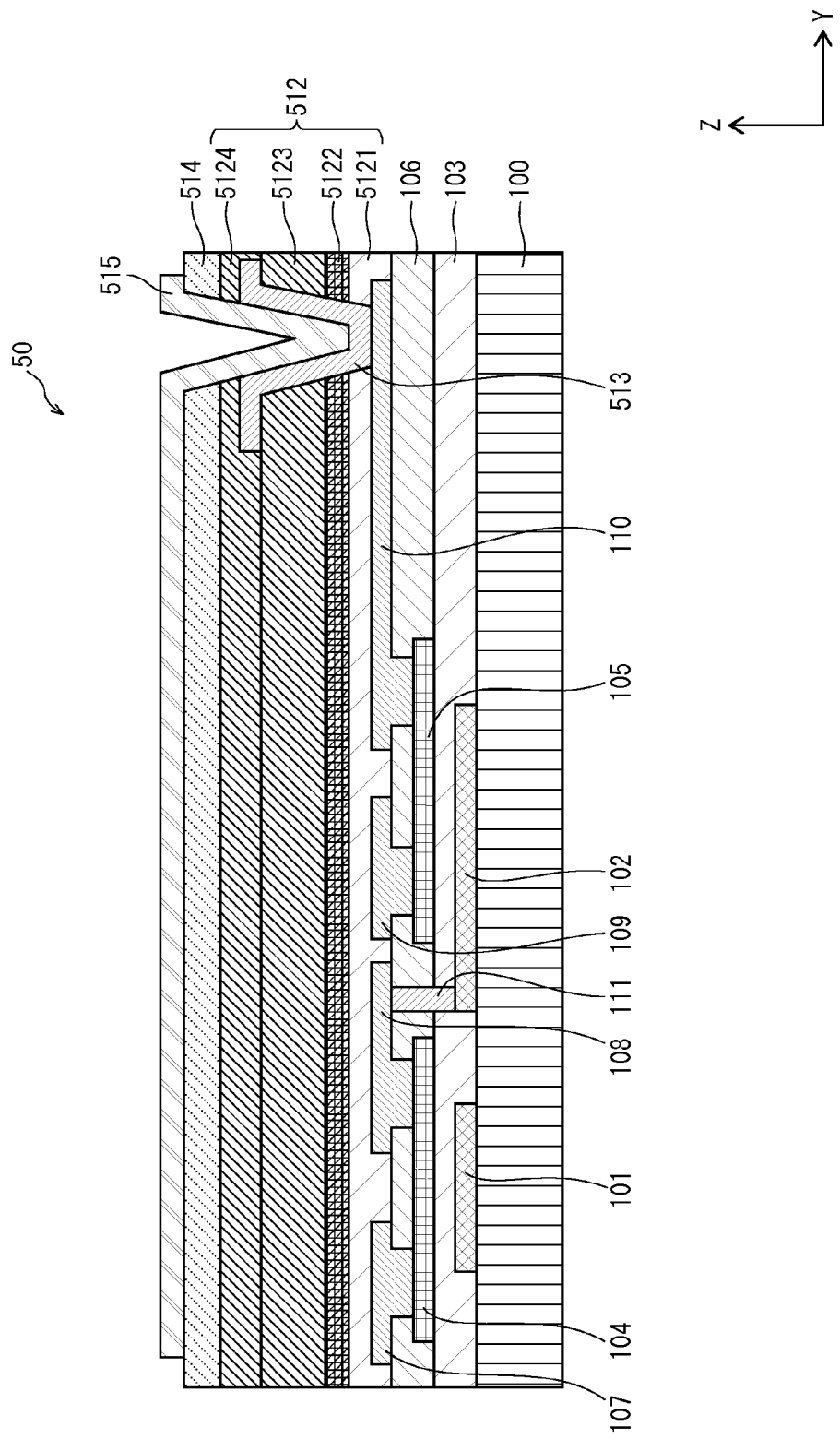

FIG. 18 is a schematic cross-sectional diagram illustrating the structure of one part of a display panel 50 pertaining to embodiment 4 of the present disclosure.

Figure 19:
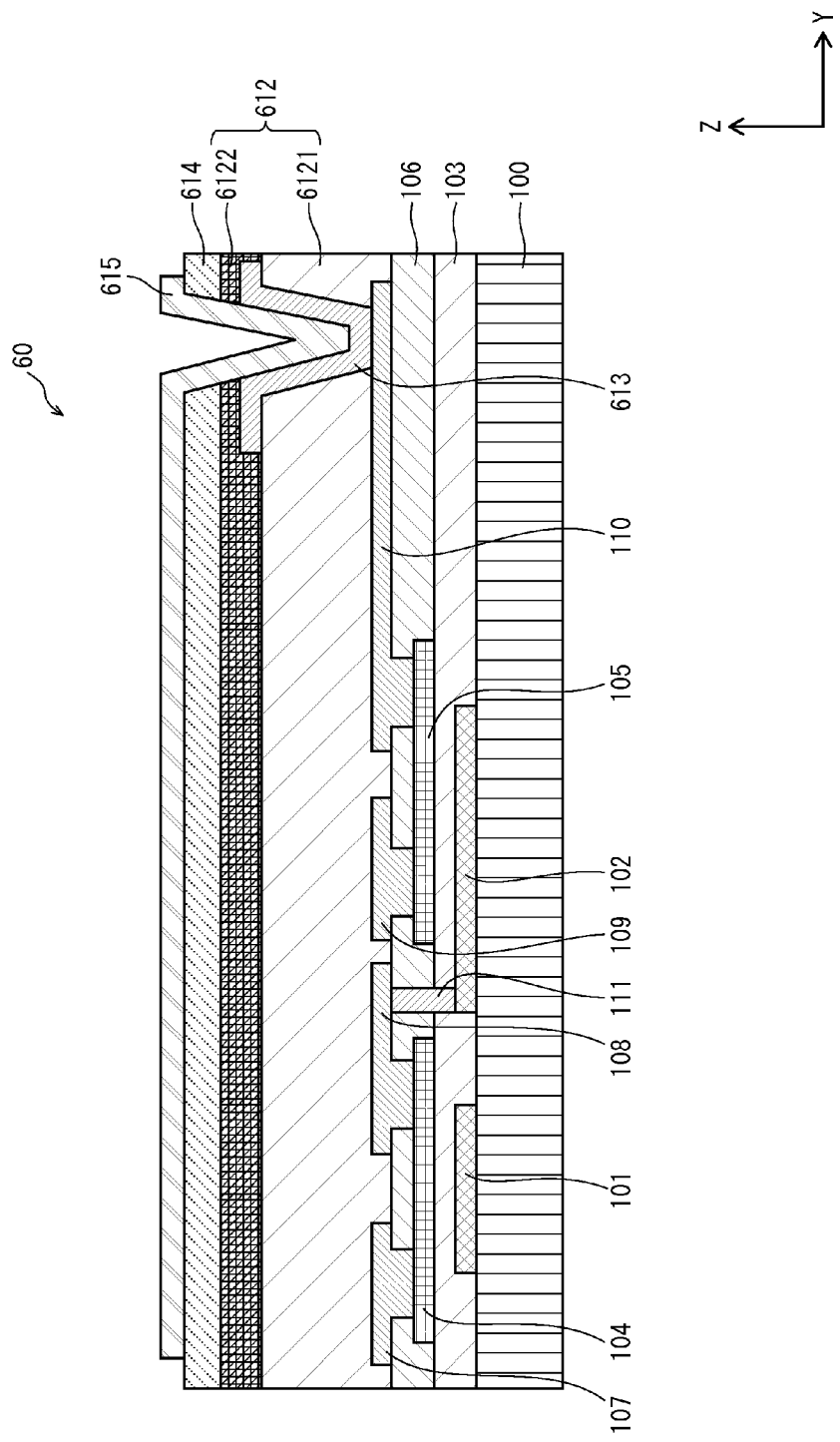

FIG. 19 is a schematic cross-sectional diagram illustrating the structure of one part of a display panel 60 pertaining to embodiment 5 of the present disclosure.

Figure 20:
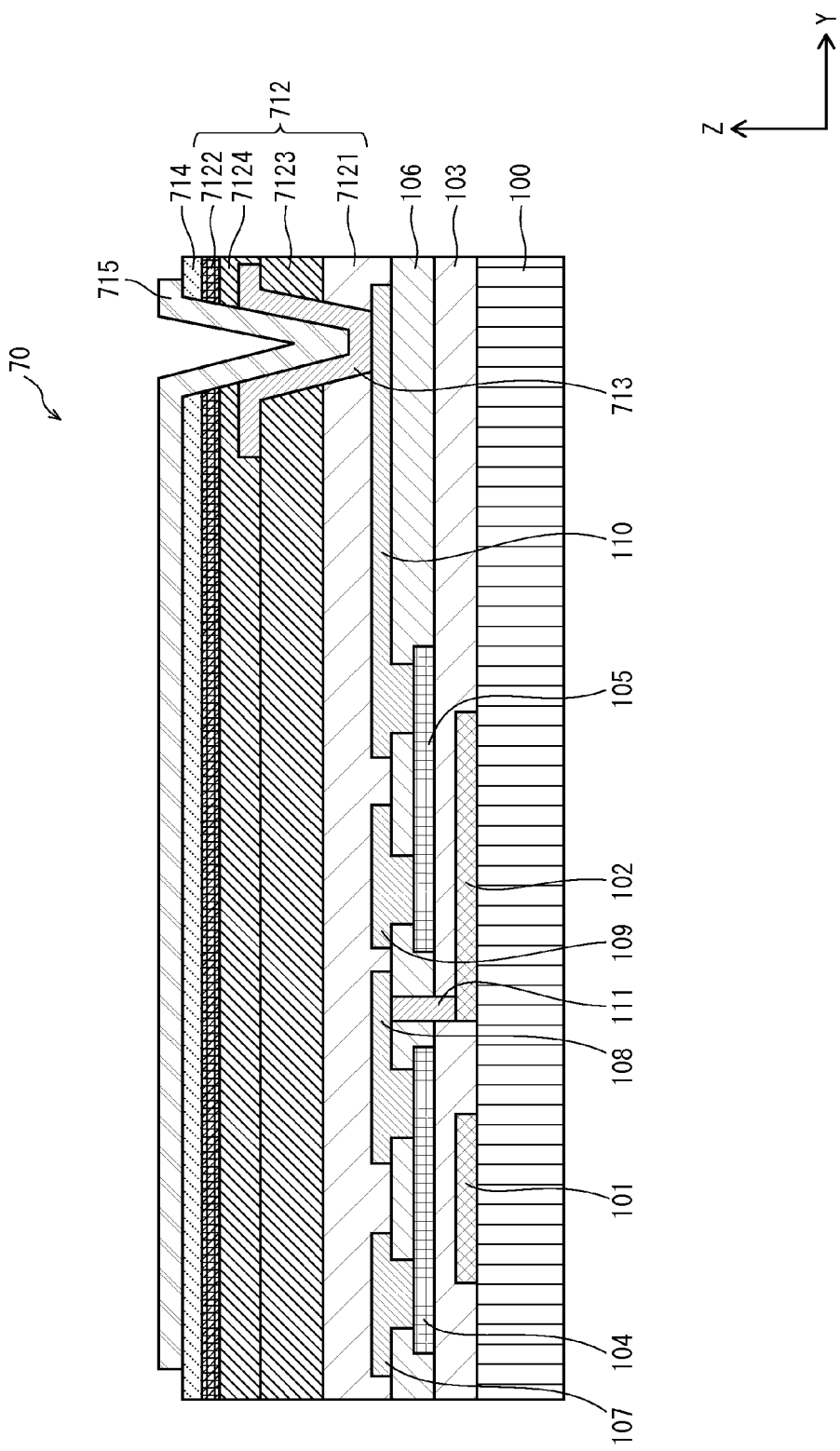

FIG. 20 is a schematic cross-sectional diagram illustrating the structure of one part of a display panel 70 pertaining to embodiment 6 of the present disclosure.

Figure 21:
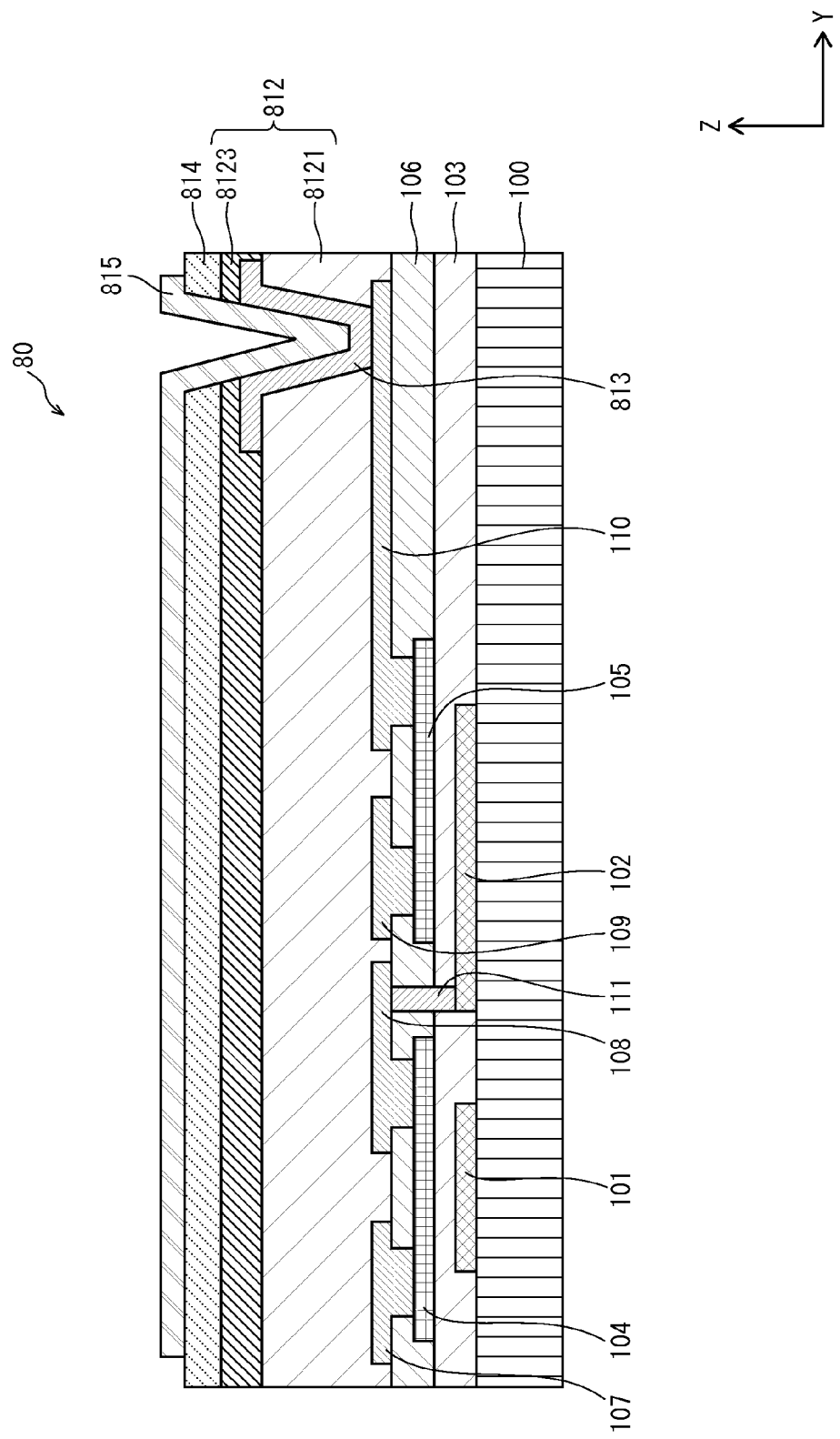

FIG. 21 is a schematic cross-sectional diagram illustrating the structure of one part of a display panel 80 pertaining to embodiment 7 of the present disclosure.

Figure 22:
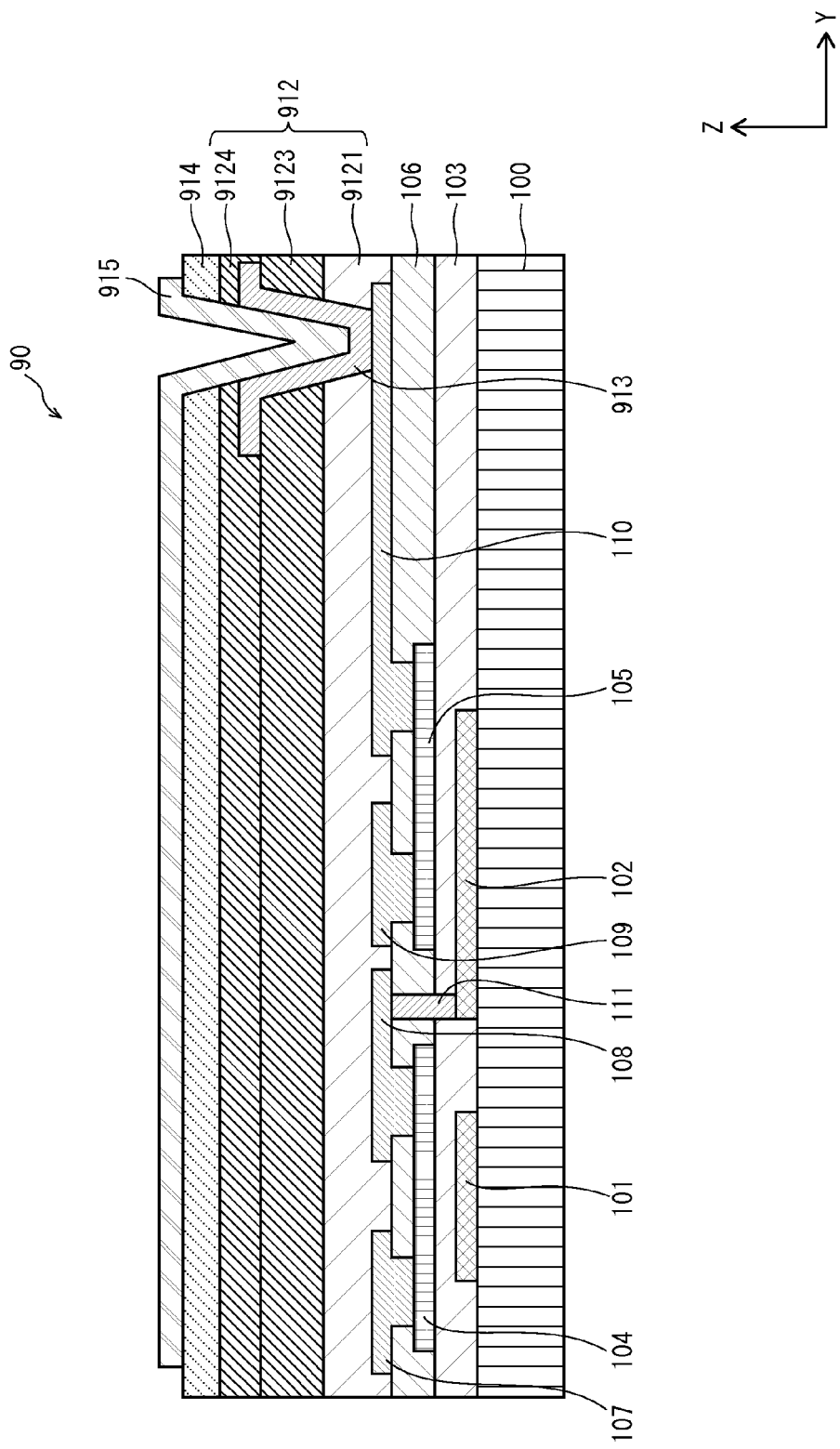

FIG. 22 is a schematic cross-sectional diagram illustrating the structure of one part of a display panel 90 pertaining to embodiment 8 of the present disclosure.

Figure 23:
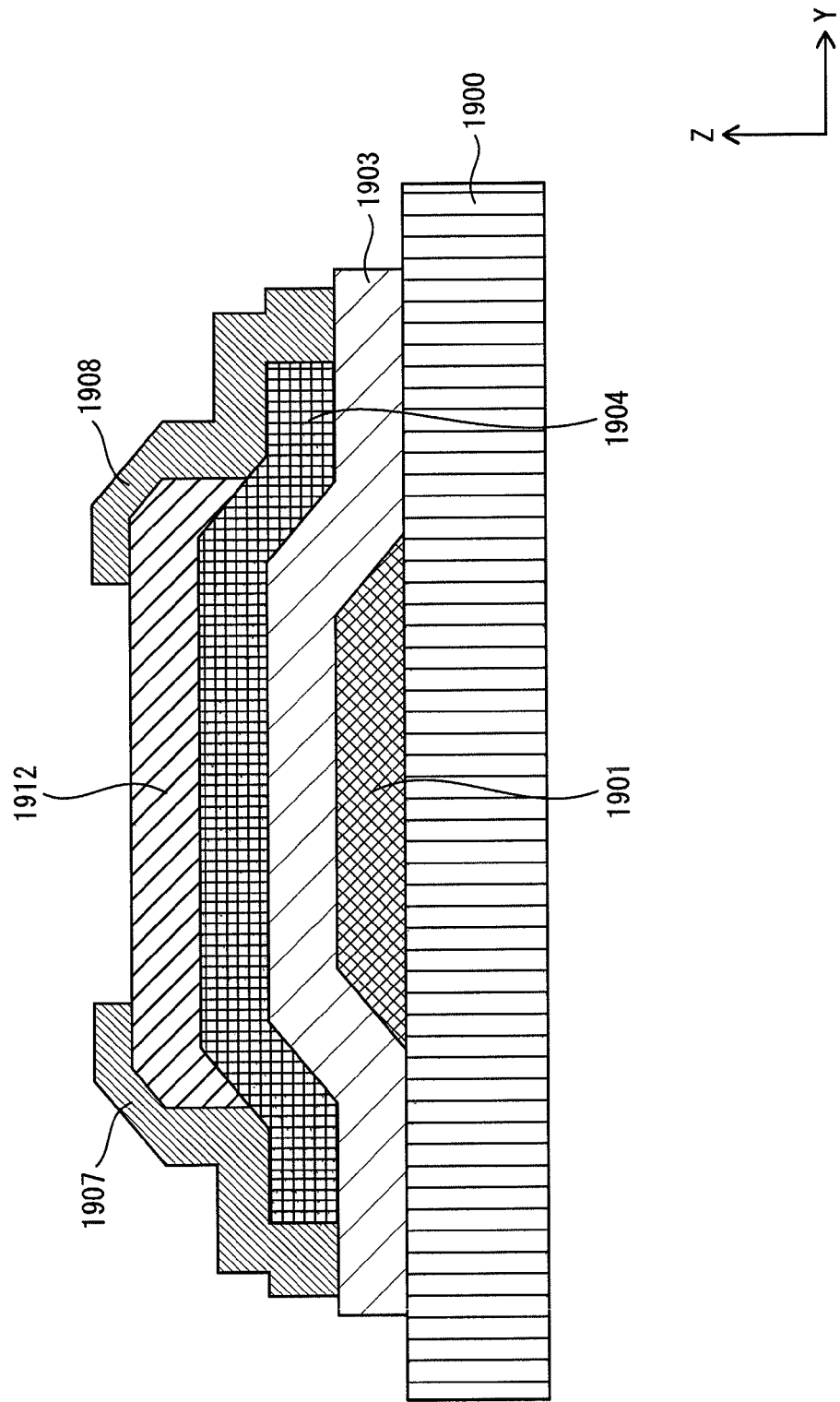

FIG. 23 is a cross-sectional diagram illustrating the structure of a conventional TFT device.

DESCRIPTION OF EMBODIMENTS

One aspect of the present disclosure is a TFT device including (i) a substrate, (ii) a gate electrode, (iii) a channel layer, (iv) a channel protection layer, (v) an electrode pair composed of a source electrode and a drain electrode, and (vi) a passivation layer.

The gate electrode is above the substrate.

The channel layer is above the gate electrode.

The channel protection layer is on the channel layer.

The electrode pair is on the channel protection layer, with the source electrode and the drain electrode spaced away from one another. A part of each of the source electrode and the drain electrode is in contact with the channel layer through the channel protection layer.

The passivation layer extends over the gate electrode, the channel layer, the electrode pair, and the channel protection layer.

In the TFT device pertaining to one aspect of the present disclosure, the channel layer is made of an oxide semiconductor, and the thin film transistor device has a first sub-layer which is made of one of silicon nitride and silicon oxynitride and in which a density of H atoms bonded with Si atoms is no greater than $2.3 \times 10^{21}$ cm$^{-3}$, the first sub-layer included in at least one of the channel protection layer and the passivation layer.

The TFT device pertaining to one aspect of the present disclosure suppresses the influence of active hydrogen species generated during processing and after film forming. Thus, the TFT device pertaining to one aspect of the present invention has high stability and reliability.

Further, in the TFT device pertaining to one aspect of the present disclosure, the channel layer achieves high electron mobility due to being made of an oxide semiconductor. Due to this, the TFT device pertaining to one aspect of the present disclosure achieves excellent electric characteristics, irrespective of temperature.

In the TFT device pertaining to one aspect of the present disclosure, in the first sub-layer, the density of H atoms bonded with Si atoms may be no greater than $1.3 \times 10^{21}$ cm$^{-3}$.

In the TFT device pertaining to one aspect of the present disclosure, the thin film transistor device may have a second sub-layer which is made of one of silicon oxide and silicon oxynitride and such that when thermal desorption measurement is performed with respect to the second sub-layer, hydrogen is observed as desorption gas and within a temperature range of 300 degrees Celsius to 350 degrees Celsius, an average increase coefficient of the desorption gas does not take a positive value, the second sub-layer included in at least one of the channel protection layer and the passivation layer.

Due to including the second sub-layer characterized as described above, the TFT device pertaining to one aspect of the present disclosure has high stability and reliability in terms of carrier lifetime and carrier density.

In the TFT device pertaining to one aspect of the present disclosure, the second sub-layer may be included in the channel protection layer.

In the TFT device pertaining to one aspect of the present disclosure, the channel protection layer may be made of silicon oxide, formed at a rate between 50 nm/sec and 110 nm/sec, and have a refractive index between 1.454 and 1.461.

In the TFT device pertaining to one aspect of the present disclosure, the passivation layer may include a first layer, a second layer, and a third layer layered one on top of another with the first layer closest to the substrate, at least one of the first layer and the third layer may correspond to the first sub-layer, and the second layer may be made of an Al compound.

Due to the second layer of the passivation layer being made of an Al compound, entry of moisture and/or active hydrogen species into the channel layer, which is made of an oxide semiconductor, is suppressed with a further degree of certainty. Thus, the TFT device pertaining to one aspect of the present invention has even higher quality.

In the TFT device pertaining to one aspect of the present disclosure, the second layer may be made of AlOx.

In the TFT device pertaining to one aspect of the present disclosure, the passivation layer may further include a fourth layer on the third layer, the third layer and the fourth layer may both be made of silicon nitride, and the third layer may contain silicon nitride at a lower density than the fourth layer. Due to the third layer containing silicon nitride at a lower density than the fourth layer, forming of a tapered contact hole in the passivation layer is facilitated.

In the TFT device pertaining to one aspect of the present disclosure, the first layer may be made of silicon oxide, and may be in contact with the source electrode and the drain electrode. It is preferable to use silicon oxide as the material for the first layer of the passivation layer because high adhesiveness of the first layer with respect to the source and drain electrodes can be ensured and hydrogen content in the first layer can be reduced.

One aspect of the present disclosure is a display device including any of the TFT devices described above. Thus, the display device achieves the effects described above.

One aspect of the present disclosure is a method for manufacturing a TFT device including the following steps (i) through (v).

(i) Forming a gate electrode above a substrate.

(ii) Forming a channel layer above the gate electrode.

(iii) Forming a channel protection layer on the channel layer, the channel protection layer having holes penetrating therethrough.

(iv) Forming an electrode pair on the channel protection layer, the electrode pair composed of a source electrode and a drain electrode that are spaced away from one another, each of the source electrode and the drain electrode having a part contacting the channel layer through a corresponding one of the holes penetrating through the channel protection layer.

(v) Forming a passivation layer extending over the gate electrode, the channel layer, and the electrode pair.

In the method pertaining to one aspect of the present disclosure, the channel layer is made of an oxide semiconductor in step (ii), and the method includes forming a first sub-layer which is made of one of silicon nitride and silicon oxynitride and in which a density of H atoms bonded with Si atoms is no greater than $2.3\times10^{21}$ cm$^{-3}$, the forming of the first sub-layer included in at least one of the forming of the channel protection layer (step (iii)) and the forming of the passivation layer (step (v)).

In the method pertaining to one aspect of the present disclosure, the influence of active hydrogen species generated during processing and after film forming is suppressed. Thus, the method pertaining to one aspect of the present invention yields a TFT device having high stability and reliability.

Further, in step (ii) of the method pertaining to one aspect of the present disclosure, the channel layer is formed by using an oxide semiconductor. Due to this, the channel layer achieves high electron mobility. Due to this, the method pertaining to one aspect of the present disclosure yields a TFT device achieving excellent electric characteristics, irrespective of temperature.

The method pertaining to one aspect of the present disclosure may further include immediately after the forming of the first sub-layer, performing annealing with respect to the first sub-layer under a temperature lower by 50 degrees than a temperature under which the first sub-layer is formed. Performing annealing under such a temperature immediately after the forming of the first sub-layer prevents the desorption of hydrogen from the first sub-layer, and thus enables the channel layer to maintain a state of high resistance. Otherwise, desorption of hydrogen from the first sub-layer may occur, which may trigger degradation of the channel layer, which is made of an oxide semiconductor, and may further result in a decrease in the resistance of the channel layer.

In specific, in the forming of the first sub-layer, the substrate having the channel layer formed thereon is placed in a vacuum. This results in oxygen defects in the channel layer, which is made of an oxide semiconductor, and a consequent decease in the resistance of the channel layer.

In view of this, in the method pertaining to one aspect of the present disclosure, annealing is performed under the temperature conditions described above immediately after the forming of the first sub-layer, whereby the channel layer maintains the state of high resistance.

The method pertaining to one aspect of the present disclosure includes forming a second sub-layer, the second sub-layer made of one of silicon oxide and silicon oxynitride and such that, when thermal desorption measurement is performed with respect to the second sub-layer, hydrogen is observed as desorption gas and within a temperature range of 300 degrees Celsius to 350 degrees Celsius, an average increase coefficient of the desorption gas does not take a positive value, the forming of the second sub-layer included in at least one of the forming of the channel protection layer (step (iii)) and the forming of the passivation layer (step (v)). The forming of the second sub-layer suppresses the influence of active hydrogen species generated during processing and after film forming, and reduces a threshold shift ($\Delta$Vth) occurring in negative bias temperature stress (NBTS) measurement. Thus, the method pertaining to one aspect of the present disclosure yields a TFT device having high reliability.

In the method pertaining to one aspect of the present disclosure, the forming of the second sub-layer may at least be included in the forming of the channel protection layer (step (iii)), and the second sub-layer may be made of silicon oxide, formed at a rate between 50 nm/sec and 110 nm/sec, and have a refractive index between 1.454 and 1.461. With this, the method pertaining to one aspect of the present disclosure yields a TFT device whose characteristics are even more stabile.

The method pertaining to one aspect of the present disclosure may further include, immediately after the forming of the second sub-layer, performing annealing with respect to the second sub-layer in a dry air atmosphere or an oxygen atmosphere and under a temperature no lower than a temperature under which the second sub-layer is formed. As already described above in connection with the annealing performed with respect to the first sub-layer, performing annealing under the conditions described above immediately after the forming of the second sub-layer enables the channel layer to maintain a state of high resistance.

In the method pertaining to one aspect of the present disclosure, the forming of the second sub-layer may at least be included in the forming of the passivation layer, and the forming of the passivation layer (step (v)) may include: forming the second sub-layer to cover the source electrode and the drain electrode, the second sub-layer made of silicon oxide; forming a layer made of an Al compound on the second sub-layer; and forming the first sub-layer on the layer made of the Al compound, the first sub-layer made of silicon nitride.

The method pertaining to one aspect of the present disclosure, in this case, yields a TFT device including a passivation layer that is composed of the second sub-layer made of silicon oxide, the layer made of an Al compound, and the first sub-layer made of silicon nitride layered one on top of another. In the TFT device, the layer made of an Al compound included in the passivation layer prevents entry of moisture and/or hydrogen (functions as a barrier), and thus protects the channel layer.

Further, in the method pertaining to one aspect of the present disclosure in this case, each of (i) the difference between the etching rate of the second sub-layer and the etching rate of the layer made of an Al compound and (ii) the difference between the etching rate of the layer made of an Al compound and the etching rate of the first sub-layer are great, and thus, it can be ensured that the etching of the layer below can be started with the etching of the present layer completed by performing over etching. Accordingly, the method pertaining to one aspect of the present disclosure achieves high manufacturing yield while suppressing the degradation of the channel layer, which is made of an oxide semiconductor.

Here, in order to achieve the effects described above, it is preferable that etching of each of the second sub-layer and the first sub-layer be performed through dry etching, and that etching of the layer made of an Al compound be performed through wet etching.

In the method pertaining to one aspect of the present disclosure, in step (v), the layer formed on the second layer may be made of AlOx. Accordingly, the passivation layer is formed to include a layer made of AlOx. Thus, entry of moisture and/or active hydrogen species into the channel layer, which is made of an oxide semiconductor, is suppressed with a further degree of certainty. Thus, the method pertaining to one aspect of the present invention yields a TFT device having even higher quality.

Embodiment 1

1. Overall Structure of Display Device 1

Figure 1:
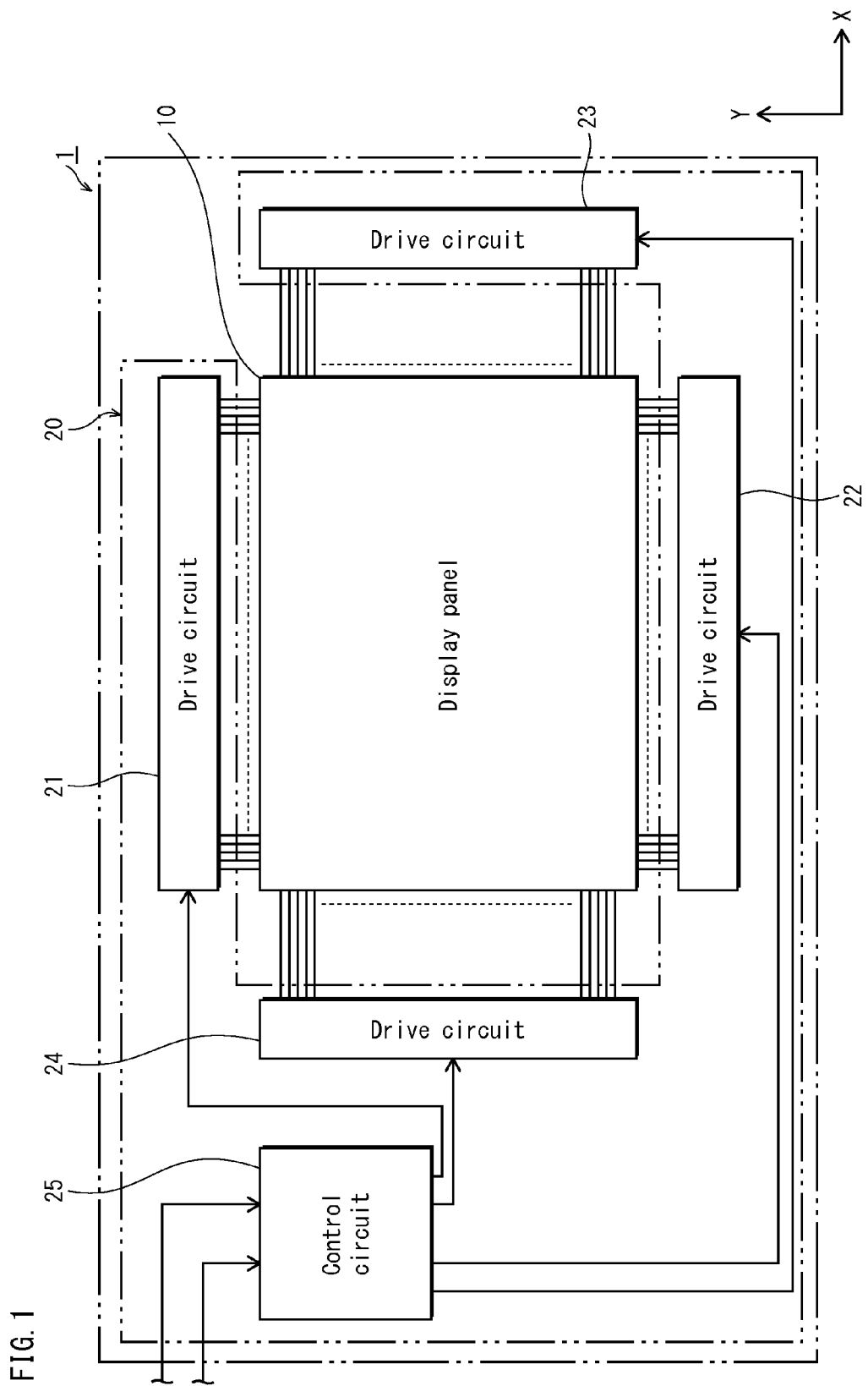
FIG. 1 is a schematic block diagram illustrating the structure of a display device 1 pertaining to embodiment 1 of the present disclosure.

The following describes the overall structure of a display device 1 pertaining to embodiment 1 of the present disclosure, with reference to FIG. 1.

As illustrated in FIG. 1, the display device 1 includes a display panel 10, and a drive/control circuit 20 connected to the display panel 10.

The display panel 10 is an organic electro-luminescent (EL) panel utilizing an electric-field light-emitting phenomenon related to organic material. The display panel 10 includes a plurality of organic EL elements, and for example, the organic EL elements form a matrix. The drive/control circuit 20 includes four drive circuits, namely drive circuits 21, 22, 23, 24 and a control circuit 25.

Note that in the display device 1, the arrangement of the circuits of the drive/control circuit 20 may differ from what is illustrated in FIG. 1.

2. Circuit Configuration of Display Panel 10

Figure 2:
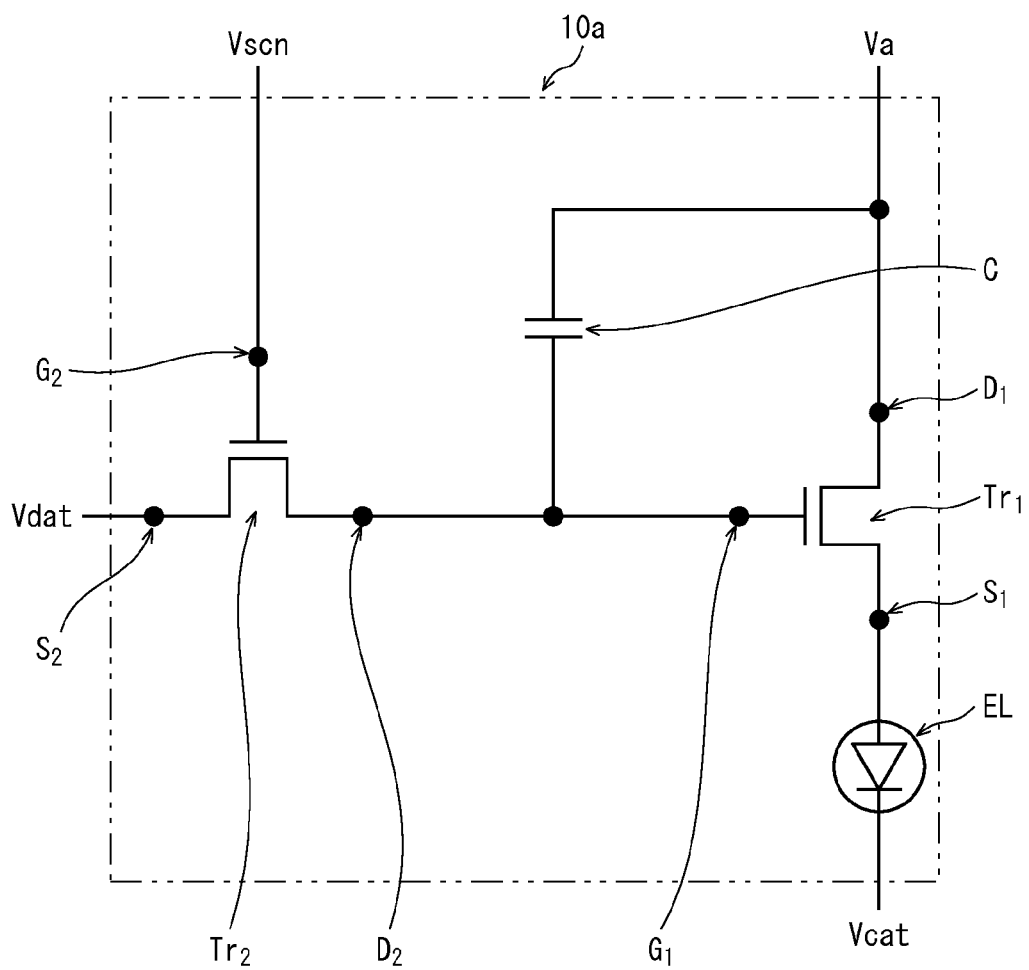
FIG. 2 is a schematic circuit diagram illustrating the circuit configuration of each subpixel 10a of a display panel 10.

The following describes the circuit configuration of each of a plurality of sub-pixels 10a of the display panel 10, with reference to FIG. 2.

As illustrated in FIG. 2, each subpixel 10a in the display panel 10 includes one capacitor C, an EL element EL part that emits light, and two transistor elements, namely transistor elements $Tr_1$, $Tr_2$. The transistor element $Tr_1$ is a driving transistor element, and the transistor element $Tr_2$ is a switching transistor element.

The switching transistor element $Tr_2$ includes a gate electrode $G_2$, a source electrode $S_2$, and a drain electrode $D_2$. The gate electrode $G_2$ is connected to a scan line Vscn. The source electrode $S_2$ is connected to a data line Vdat. The drain electrode $D_2$ is connected to a gate electrode $G_1$ of the driving transistor element $Tr_1$.

The driving transistor element includes, in addition to the gate electrode $G_1$, a drain electrode $D_1$ and a source electrode $S_1$. The drain electrode $D_1$ is connected to a power line Va. The source electrode $S_1$ is connected to an anode of the EL element E part. Meanwhile, the EL element part EL has a cathode that is connected to a ground line Vcat.

The capacitor C connects each of the drain electrode $D_2$ of the switching transistor element $Tr_2$ and the gate electrode $G_1$ of the driving transistor element $Tr_1$ to the power line Va.

In the display panel 10, the sub-pixels 10a, each having the circuit configuration illustrated in FIG. 2, form a matrix, for example. For example, a set of a plurality of sub-pixels 10a adjacent to one another (for example, a set of three adjacent subpixels 10a each corresponding to one of the light-emission colors red (R), green (G), and blue (B)) forms a pixel of the display panel 10.

3. Structure of Display Panel 10

Figure 3:
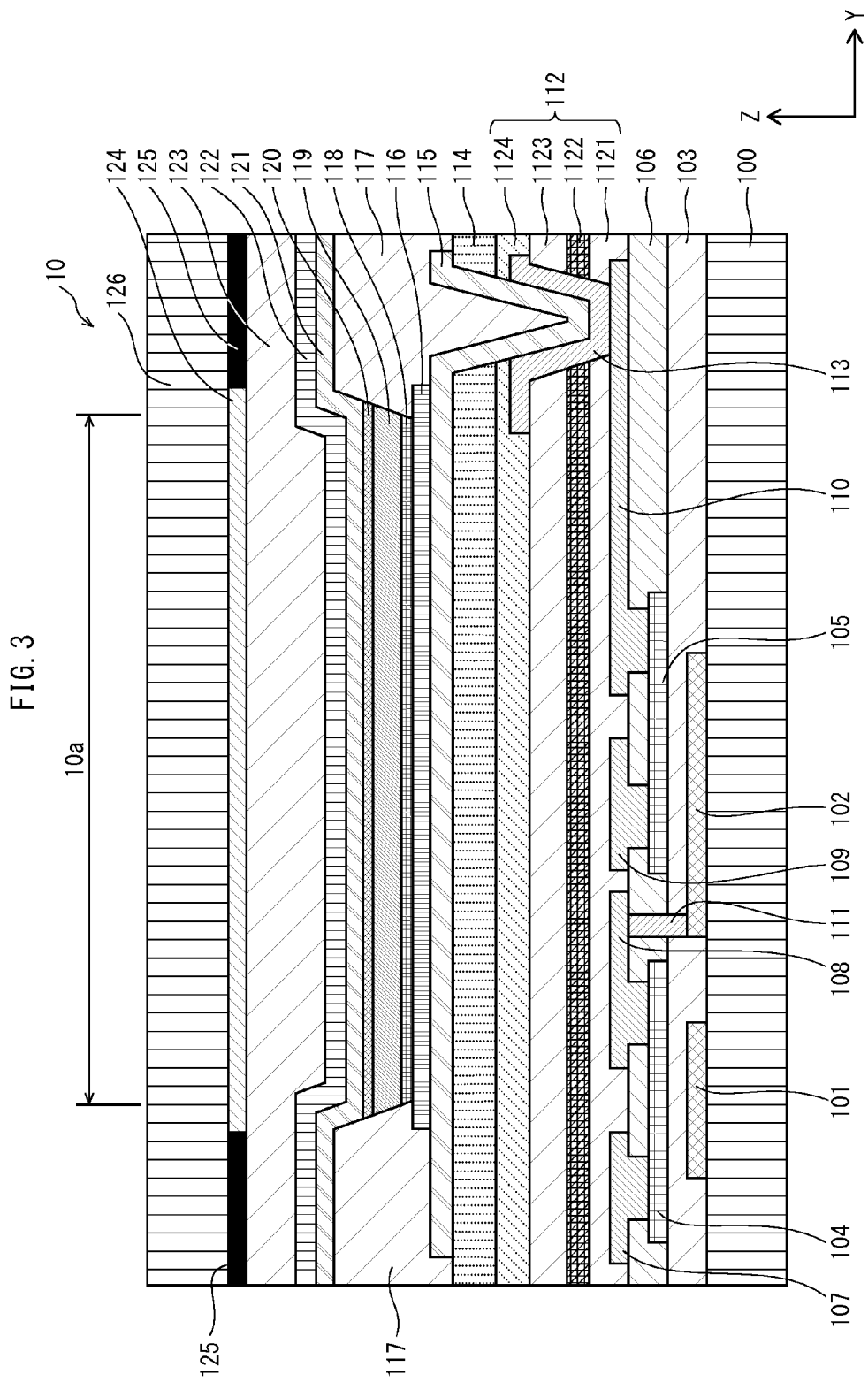
FIG. 3 is a schematic cross-sectional diagram illustrating the structure of each subpixel 10a of the display panel 10.

The following describes the structure of the display panel 10, with reference to the schematic cross-sectional view in FIG. 3.

The display panel 10 is a top-emission-type organic EL display panel. The display panel 10 includes a TFT device part and an EL element part. The TFT device part is arranged lower in the Z axis direction, and the EL element part is disposed on the TFT device part.

(1) TFT Device Part

As illustrated in FIG. 3, above a substrate 100, gate electrodes 101 and 102 are disposed spaced from one another. A gate insulating layer 103 is disposed to cover surfaces of the gate electrodes 101 and 102 and a surface of the substrate 100. Channel layers 104 and 105 are disposed on the gate insulating layer 103. The channel layers 104 and 105 respectively correspond to the gate electrodes 101 and 102. A channel protection layer 106 is disposed to cover surfaces of the channel layers 104 and 105 and a surface of the gate insulating layer 103.

A source electrode 107 and a drain electrode 108 are disposed spaced from one another on the channel protection layer 106. The source electrode 107 and the drain electrode 108 correspond to the gate electrode 101 and the channel layer 104. Similarly, a source electrode 110 and a drain electrode 109 are disposed spaced from one another on the channel protection layer 106. The source electrode 110 and the drain electrode 109 correspond to the gate electrode 102 and the channel layer 105.

Z-axis direction bottom portions of the source electrode 107 and the drain electrode 108 are in contact with the channel layer 104, via respective contact holes formed in the channel protection layer 106. Similarly, Z-axis direction bottom portions of the source electrode 110 and the drain electrode 109 are in contact with the channel layer 105, via respective contact holes formed in the channel protection layer 106. Further, the drain electrode 108 and the gate electrode 102 are connected via a contact plug 111. The contact plug 111 penetrates through the gate insulating layer 103 and the channel protection layer 106.

The gate electrode 101 corresponds to the gate electrode $G_2$ in FIG. 2, the source electrode 107 corresponds to the source electrode $S_2$ in FIG. 2, and the drain electrode 108 corresponds to the drain electrode $D_2$ in FIG. 2. Similarly, the gate electrode 102 corresponds to the gate electrode $G_1$ in FIG. 2, the source electrode 110 corresponds to the source electrode $S_1$ in FIG. 2, and the drain electrode 109 corresponds to the drain electrode $D_1$ in FIG. 2. Thus, FIG. 3 illustrates the switching transistor element $Tr_2$ in the left side thereof in the Y-axis direction, and illustrates the driving transistor element $Tr_1$ in the right side thereof in the Y-axis direction. However, the switching transistor element $Tr_1$ and the driving transistor element $Tr_2$ need not be arranged as illustrated in FIG. 3.

A passivation layer 112 is disposed to cover the source electrodes 107 and 110, the drain electrodes 108 and 109, and the channel protection layer 106. The passivation layer 112 has a contact hole formed therein above the source electrode 110. An upper electrode 113 is disposed to cover an inner wall of the passivation layer 112 defining the contact hole.

The passivation layer 112 is composed of a lower insulating layer 1121, a barrier layer 1122, a first upper insulating layer 1123, and a second upper insulating layer 1124 layered one on top of another in this order, with the lower insulating layer 1121 lowermost in the Z axis direction.

An interlayer insulating layer 114 is deposited on the passivation layer 112.

(2) EL Element Part

An anode 115 is disposed on the interlayer insulating layer 114. The anode 115 corresponds to one subpixel 10a. The anode 115 is connected to the upper electrode 113 at the bottom of a contact hole formed in the interlayer insulating layer 114 and the upper insulating layer 1124 above the upper electrode 113.

A hole injection layer 116 is formed on the anode 115. Further, banks 117 are formed on the anode 115. The banks 117 each cover one edge of the hole injection layer 116. The banks 117 define an opening that corresponds to one subpixel 10a.

A hole transport layer 118, a light-emitting layer 119, and an electron transport layer 120 are disposed in this order one on top of another with the hole transport layer 118 lowermost in the Z axis direction, inside the opening defined by the banks 117. A Z-axis direction bottom portion of the hole transport layer 118 is in contact with the hole injection layer 116.

A cathode 121 and a sealing layer 122 are disposed in this order one on top of another to cover the electron transport layer 120 and the banks 117. The cathode 121 extends continuously over the entire display panel 10. The cathode 121 is connected to bus bar wirings each corresponding to one pixel or a group of a few pixels (not illustrated in FIG. 3).

An adhesion layer 123 disposed on the sealing layer 122 in the Z axis direction adheres the sealing layer 122 to a color filter layer 124 and light blocking layers 125. The color filter layer 124 and the light-blocking layers 125 are formed on a main surface (Z-axis direction bottom surface) of a substrate 126.

(3) Materials of Constituent Elements

The following provides examples of material usable for the constituent elements illustrated in FIG. 3.

(i) Substrates 100, 130

Each of the substrates 100, 130 may be, for example: a glass substrate; a quartz substrate; a silicon substrate; a metal substrate made of a metal such as molybdenum sulfide, copper, zinc, aluminum, stainless steel, magnesium, iron, nickel, gold, or silver; a semiconductor substrate made of a semiconductor such as gallium arsenide; or a plastic substrate.

When implementing at least one of the substrates 100, 130 by using a plastic substrate, the resin of the plastic substrate may either be thermoplastic resin or thermosetting resin. Examples of such resins include polyolefins, such as polyethylene, polypropylene, ethylene-propylene copolymers, and ethylene-vinyl acetate copolymers (EVA), cyclic polyolefin, modified polyolefins, polyvinyl chloride, polyvinylidene chloride: polystyrene, polyamide, polyimide (PI), polyamide-imide, polyesters, such as polycarbonate, poly (4-methylpentene-1), ionomers, acrylic-based resins, polymethyl methacrylater acrylic-styrene copolymers (AS resins), butadiene-styrene copolymers, ethylene vinyl alcohol copolymers (EVOH), polyethylene terephthalate (PET), polybutylene terephthalate, polyethylene naphthalate (PEN), and polycyclohexane terephthalate (PCT), polyether, polyether ketone, polyethersulfone (PES), polyether imide, polyacetal, polyphenylene oxide, modified polyphenylene oxide, polyarylate, aromatic polyesters (liquid crystal polymer), polytetrafluoroethylene, polyvinylidene fluoride, other fluorocarbon resins, thermoplastic elastomers, such as styrene-based elastomers, polyolefin-based elastomers, polyvinyl chloride-based elastomers, polyurethane-based elastomers, fluorocarbon rubbers, and chlorinated polyethylene-based elastomers, epoxy resins, phenolic resins, urea resins, melamine resins, unsaturated polyesters, silicone resins, and polyurethane, and copolymers, blends, and polymer alloys thereof. The plastic substrate may be composed of two or more layers of one of such materials or two or more of such materials.

(ii) Gate Electrode 101, 102

Each of the gate electrodes 101, 102 is, for example, composed of a copper layer having a thickness of 300 nm and a molybdenum layer having a thickness of 20 nm. However, the gate electrodes 101, 102 need not have such a structure, and each may be made of only copper or a combination of copper and tungsten. Alternatively, the gate electrodes 101, 102 may each be made of the following materials.

Examples of other material usable for the gate electrodes 101, 102 include: metals, such as chromium, aluminum, tantalum, niobium, silver, gold, platinum, palladium, indium, nickel, and neodymium, and alloys thereof; conductive metal oxides, such as zinc oxide, tin oxide, indium oxide, and gallium oxide; conductive metal complex oxides, such as indium tin complex oxide (ITO), indium zinc complex oxide (IZO), aluminum zinc complex oxide (AZO), and gallium zinc complex oxide (GZO); conductive polymers, such as polyaniline, polypyrrole, polythiophene, and polyacetylene, and conductive polymers doped with acids, e.g., hydrochloric acid, sulfuric acid, and sulfonic acid, Lewis acids, e.g., phosphorus pentafluoride, arsenic pentafluoride, and iron chloride, halogen elements, e.g., iodine, and metals, e.g., sodium and potassium; and conductive composite materials containing carbon black and metal particles dispersed. Alternatively, polymer mixtures containing electrically-conductive particles, such as fine metal particles or graphite, may be used. These materials may be used alone or in combination.

(iii) Gate Insulating Layer 103

The gate insulating layer 103 is, for example, a combination of a silicon oxide layer having a thickness of 85 nm and a silicon nitride layer having a thickness of 65 nm. However, the gate insulating layer 103 need not have such a structure, and for example, may be made of any known organic material or inorganic having electrically-insulative properties.

Further, the ratio between the thicknesses of the layers composing the gate insulating layer 103 (in this example, the ratio between the thicknesses of the silicon oxide layer and the silicon nitride layer) may be changed as long as the total thickness of the gate insulating layer 103 is within a range of 150 nm to 400 nm. For example, increasing the thickness of the SiN layer and decreasing the thickness of the SiO layer without changing the total thickness of the gate insulating layer 103 provides the gate insulating layer 103 with higher withstand voltage but with lower electrostatic capacity. Thus, composing the gate insulating layer 103 with two or more layers each made of a different material increases the flexibility in device design, and further, enables providing the two or more layers each with optimum thickness considering the designed TFT characteristics.

Examples of organic materials usable for the gate insulating layer 103 include acrylic resins, phenolic resins, fluororesins, epoxy resins, imide resins, and novolac type resins.

Examples of inorganic materials usable for the gate insulating layer 103 include: metal oxides, such as silicon oxide, aluminum oxide, tantalum oxide, zirconium oxide, cerium oxide, zinc oxide, and cobalt oxide; metal nitrides, such as silicon nitride, aluminum nitride, zirconium nitride, cerium nitride, zinc nitride, cobalt nitride, titanium nitride, and tantalum nitride; and metal complex oxides, such as barium strontium titanate and lead zirconate titanate. These may be used alone or in combination.

Further, one or more surfaces of the gate insulating layer 103 may be processed by using a surface treatment agent (ODTS OTS HMDS βPTS) or the like.

(iv) Channel Layers 104, 105

Each of the channel layers 104, 105 is made of amorphous indium gallium zinc oxide (IGZO) and has a thickness of 60 nm. However, the channels layer 104, 105 need not be made of amorphous IGZO. That is, it suffices for the channel layers 104, 105 to be made of an oxide semiconductor including at least one of indium, gallium, and zinc.

Further, the channel layers 104, 105 may have any thickness within the range of 20 nm to 200 nm. Further, the channel layers 104 and 105 may have different thicknesses.

(v) Channel Protection Layer 106

The channel protection layer 106 is made of silicon oxide and has a thickness of 240 nm. However, the channel protection layer 106 need not be made of silicon oxide. That is, for example, the channel protection layer 106 may be made of silicon oxynitride.

Further, the channel protection layer 106 may have any thickness within the range of 50 nm and 500 nm.

In the present embodiment, the channel protection layer 106 is defined such that, when thermal desorption measurement is performed with respect to the channel protection layer 106, hydrogen is observed as desorption gas and within a temperature range of 300 degrees Celsius to 350 degrees Celsius, an average increase coefficient (average of differential coefficients) of the desorption gas does not take a positive value.

(vi) Source Electrodes 107, 110 and Drain Electrodes 108, 109

The source and drain electrodes (source electrodes 107, 110 and drain electrodes 108, 109) are each a combination of a copper-manganese layer having a thickness of 60 nm, a copper layer having a thickness of 300 nm, and a molybdenum layer having a thickness of 20 nm.

The source and drain electrodes may each have any thickness within the range of 100 nm to 500 nm.

(vii) Passivation Layer 112

As already described above, in the display panel 10, the passivation layer 112 is composed of the lower insulating layer 1121, the barrier layer 1122, the first upper insulating layer 1123, and the second upper insulating layer 1124 layered in this order one on top of another, with the lower insulating layer 1121 lowermost in the Z axis direction.

The lower insulating layer 1121 is made of silicon oxide and has a thickness of 200 nm.

The barrier layer 1122 is made of aluminum oxide and has a thickness of 30 nm.

The first upper insulating layer 1123 is made of silicon nitride and has a thickness of 260 nm.

The second upper insulating layer 1124 is made of silicon nitride and has a thickness of 100 nm.

As illustrated in FIG. 3, the barrier layer 1122 is sandwiched between the lower insulating layer 1121 and the first upper insulating layer 1123. The lower insulating layer 1121 is made of silicon oxide, and is in contact with the source electrodes 111, 115 and the drain electrodes 112, 114.

In the present embodiment, the lower insulating layer 1121 and the first upper insulating layer 1123, both made of silicon oxide, are defined such that, when thermal desorption measurement is performed with respect to the lower insulating layer 1121 and the first upper insulating layer 1123, hydrogen is observed as desorption gas and within a temperature range of 300 degrees Celsius to 350 degrees Celsius, an average increase coefficient of the desorption gas does not take a positive value.

The barrier layer 1122 prevents the entry of moisture and/or hydrogen, and thereby suppresses degradation of the channel layers 104, 105, which are made of an oxide semiconductor (IGZO or the like). To achieve this function, it is preferable that the barrier layer 1122 have a density of at least 2.80 g/cm$^3$. With a density lower than 2.80 g/cm$^3$, the function of the barrier layer 1122 of preventing the entry of moisture and/or hydrogen would decrease rapidly, which would bring about a prominent degradation (i.e., a decrease in sheet resistance) of the channel layers 104, 105.

In addition, it is preferable that the barrier layer 1122 have a density no greater than 3.25 g/cm$^3$. With a density greater than 3.25 g/cm$^3$, the etching rate when wet etching is performed with respect to the barrier layer 1122 would become extremely low. (Note that the wet etching is for forming the hole for the upper electrode 113 in the barrier layer 1122.) Thus, in view of manufacturing efficiency, it is preferable that the barrier layer 1122 have a density no greater than 3.25 g/cm$^3$.

Further, the second upper insulating layer 1124, which is made of SiN, is defined such that the Si—H density (the density of H atoms bonded with Si atoms) thereof is no greater than $2.3 \times 10^{21}$ cm$^{-3}$.

Materials other than those described above may be used for the lower insulating layer 1121. Examples of such material include silicon nitride and silicon oxynitride. Similarly, materials other than those described above may be used for the first upper insulating layer 1123. Examples of such material include silicon oxide and silicon oxynitride. Further, materials other than those described above may be used for the second upper insulating layer 1124. Examples of such material include silicon oxide and silicon oxynitride.

In addition, the passivation layer 112 may have a total thickness within the range of 200 nm to 1000 nm.

(viii) Upper Electrode 113

The upper electrode 113 is a combination of a copper layer having a thickness of 300 nm and an indium tin oxide layer having a thickness of 70 nm. However, other materials are usable for the upper electrode 113, as long as a material having electrical conductivity is selected.

(ix) Interlayer Insulating Layer 114

The interlayer insulating layer 114 is made of, for instance, an organic compound such as polyimide, polyamide, or acrylic resin material.

(x) Anode 115

The anode 115 is made of a metal material containing silver or aluminum. Further, in a top-emission type display panel such as the display panel 10, it is preferable that the anode 115 have a highly-reflective surface portion.

Further, the anode 115 need not be composed of a single layer of the metal materials described above. That is, the anode 115 may be a combination of a metal layer and a light-transmissive electrically-conductive layer. Examples of material usable for such a light-transmissive electrically-conductive layer include indium tin oxide and indium zinc oxide.

(xi) Hole Injection Layer 116

The hole injection layer 116 is made of, for instance, an oxide of a metal such as silver (Ag), molybdenum (Mo), chromium (Cr), vanadium (V), tungsten (W), nickel (Ni), or iridium (Ir), or an electrically-conductive polymer material such as PEDOT (an amalgam of polythiophene and polystyrene sulfonic acid). In FIG. 3, the display panel 10 is illustrated to include a hole injection layer 116 made of a metal oxide. When made of a metal oxide, the hole injection layer 116 is capable of assisting hole generation and injecting holes into the light-emitting layer 119 with a higher level of stability, compared to when the hole injection layer 116 is made of an electrically-conductive polymer material such as PEDOT. As such, the hole injection layer 116, when made of a metal oxide, has a higher work function than the hole injection layer 116, when made of an electrically-conductive polymer material.

When the hole injection layer 116 is made of an oxide of a transition metal, the hole injection layer 116 has a plurality of energy levels due to having a plurality of oxidation numbers. This makes hole injection easy and allows for reduction of driving voltage. It is particularly preferable to form the hole injection layer 116 by using tungsten oxide ($WO_x$), since the hole injection layer 116 can be provided with the function of stably injecting holes and assisting the generation of holes.

(xii) Banks 117

The banks 117 are made of an organic material such as resin and have electrically-insulative properties. Examples of organic material usable for forming the banks 117 include acrylic resins, polyimide resins, and novolac type phenolic resin. In addition, it is desirable that the banks 117 have resistance against organic solvents. Further, since the banks 117 may undergo processes such as etching, baking, etc., when being formed, it is desirable that the banks 117 be formed by using highly resistant material that will not change excessively in shape or quality during such processes. In addition, to provide the banks 117 with liquid repellency, the surfaces thereof can be fluoridated.

This is since, if a liquid-philic material is used to form the banks 117, the difference in liquid philicity/liquid repellency between the surfaces of the banks 117 and the surface of the light-emitting layer 119 becomes smaller than desirable, and it thus becomes difficult to keep ink containing an organic substance for forming the light-emitting layer 119 to be selectively held within the opening defined by the banks 117.

In addition, the banks 117 need not have a single-layer structure as shown in FIG. 3. That is, the banks 117 may be alternatively composed of two or more layers. In such a case, the above materials may be combined for each layer, or the layers may alternate between inorganic and organic material.

(xiii) Hole Transport Layer 118

The hole transport layer 118 is formed by using a high-molecular compound not containing a hydrophilic group. For instance, the hole transport layer 118 may be made of a high-molecular compound, such as polyfluorene or a polyfluorene derivative or polyallylamine or a polyallylamine derivative, but not containing a hydrophilic group.

(xiv) Light-Emitting Layer 119

The light-emitting layer 119 has a function of emitting light when an excitation state is produced by the recombination of holes and electrons injected thereto. It is desirable that material used to form the light-emitting layer 119 be a light emitting-organic material, a film of which can be formed by wet printing.

Specifically, it is desirable that the light-emitting layer 119 be made of a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as disclosed in Japanese Patent Application Publication No. H5-163488.

(xv) Electron Transport Layer 120

The electron transport layer 120 has a function of transporting, to the light-emitting layer 119, electrons injected thereto from the cathode 121. The electron transport layer 120 is made of, for instance, an oxadiazole derivative (OXD), a triazole derivative (TAZ), a phenanthroline derivative (BCP, Bphen), or the like.

(xvi) Cathode 121

The cathode 121 is made of, for instance, indium tin oxide (ITO), indium zinc oxide (IZO), or the like. Further, in a top-emission type display panel such as the display panel 10, it is desirable that the cathode 121 be made of light-transmissive material. When the cathode 121 is made of light-transmissive material, it is desirable that the cathode 121 have light-transmissivity of 80% or greater.

(xvii) Sealing Layer 122

The sealing layer 122 has a function of preventing organic layers such as the light-emitting layer 119 from being exposed to moisture and/or air, and is made of, for example, a material such as silicon nitride (SiN) or silicon oxynitride (SiON). In addition, the sealing layer 122 may further include a sealing resin layer made of a resin material such as acrylic resin or silicone resin disposed on the layer made of material such as silicon nitride (SiN) or silicon oxynitride (SiON).

Further, in a top-emission type display panel such as the display panel 10, it is desirable that the sealing layer 122 be made of light-transmissive material.

4. Method of Manufacturing Display Panel 10

The following describes a method of manufacturing the display panel 10, with reference to FIGS. 4A through 4D, FIGS. 5A through 5D, and FIGS. 6A and 6B.

(1) Forming of Gate Electrodes 101, 102

Figure 4A:
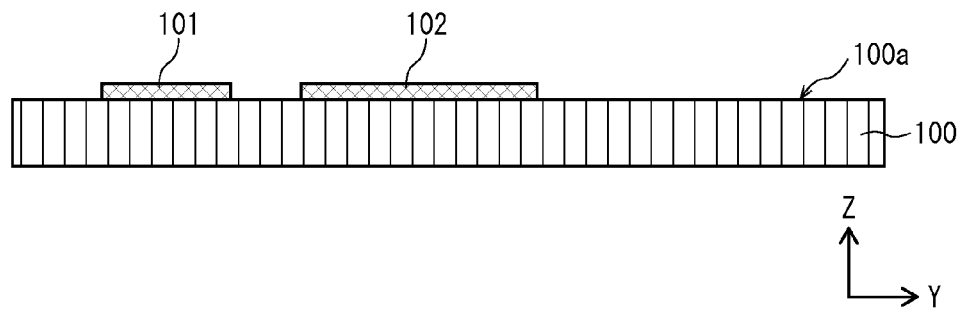

As illustrated in FIG. 4A, the gate electrodes 101, 102 are formed spaced from another, on a Z-axis direction upper surface 100a of the substrate 100. The gate electrodes 101, 102 are formed, for example, as specifically discussed in the following.

First, a metal thin film made of Cu and a metal thin film made of Mo are formed in this order one on top of another on the surface 100a, through metal sputtering. Then, a resist pattern is formed above the metal thin films through photolithography.

After subsequently performing wet-etching, the resist pattern is removed. This completes the forming of the gate electrodes 101, 102.

(2) Forming of Gate Insulating Layer 1030 and Channel Layers 104, 105

Figure 4B:
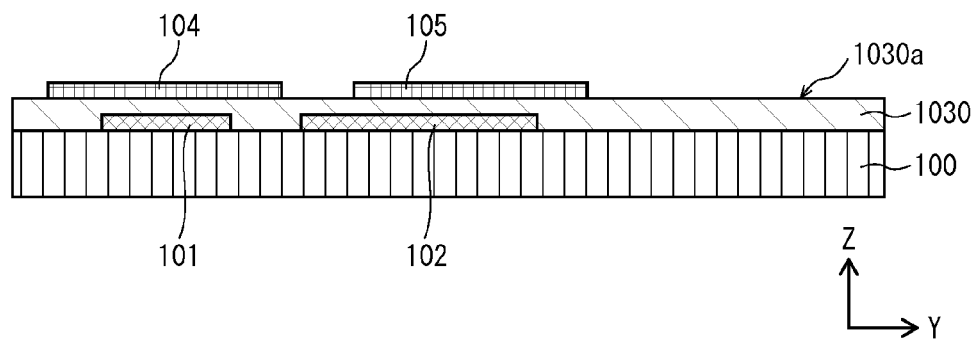

As illustrated in FIG. 4B, a gate insulating layer 1030 is formed to cover the surfaces of the gate electrodes 101, 102 and the surface 100a of the substrate 100. Further, channel layers 104, 105 are formed spaced from one another on a surface 1030a of the gate insulating layer 1030.

The gate insulating layer 1030 is formed, for example, by forming a SiO layer and a SiN layer one on top of another in this order through plasma chemical vapor deposition (CVD) or sputtering. The gate insulating layer 1030 is formed for example, under a temperature within the range of 350 degrees Celsius to 400 degrees Celsius.

The channel layers 104, 105 are formed by forming an oxide semiconductor layer through sputtering, and then patterning the oxide semiconductor layer so formed through photolithograpy and wet-etching.

(3) Forming of Channel Protection Layer 1060

Figure 4C:
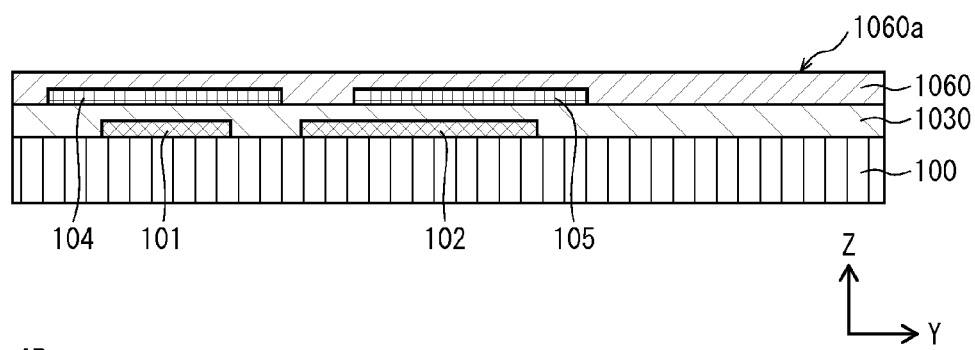

As illustrated in FIG. 4C, a channel protection layer 1060 is formed to cover the surfaces of the channel layers 104, 105, and the surface 1030a of the gate insulating layer 1030.

The channel protection layer 1060 is formed by forming a SiO layer through plasma CVD or sputtering, and subsequently performing annealing under a temperature no lower than the temperature under which the SiO layer is formed, in a dry-air atmosphere or an oxygen atmosphere.

The film-forming conditions for the channel protection layer 1060 in the present embodiment are provided in the following.

Temperature: 300 degrees Celsius
Power: 100 W
Pressure: 4 torr
$N_2O$: 1200 sccm
$SiH_4$: 16 sccm
Distance between electrodes: 550 mils The annealing performed after the forming of the SiO layer is for repairing oxygen defects in the channel layers 104, 105 occurring in the forming of the SiO layer, and thereby maintaining the semiconductor characteristics of the channel layers 104, 105.

(4) Forming of Source Electrodes 107, 110 and Drain Electrodes 108, 109

Figure 4D:
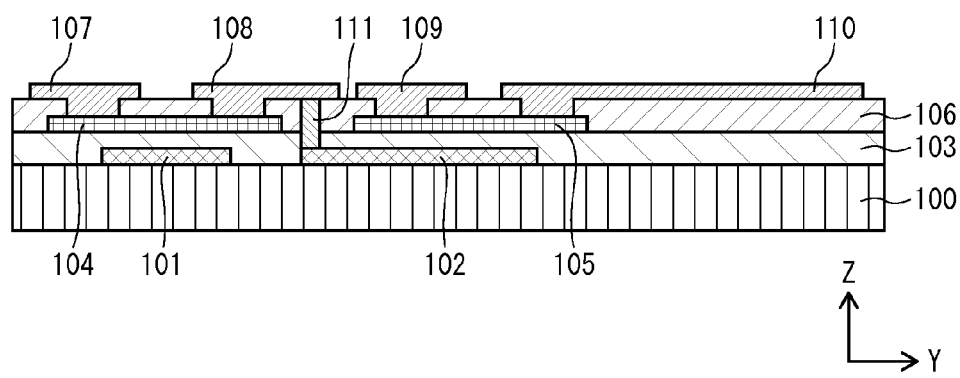

As illustrated in FIG. 4D, the source electrodes 107, 110 and the drain electrodes 108, 109 are formed on the surface 1060a of the channel protection layer 1060.

In specific, first, contact holes are formed in predetermined parts of the channel protection layer 1060 and in a predetermined part of the gate insulating layer 103 under the channel protection layer 1060. The contact holes are formed by first forming a pattern through photolithography, and then performing dry-etching.

Subsequently, the contact plug 111 is formed by filling the contact hole formed in the gate insulating layer 103 above the gate electrode 102, and further, by filling the corresponding one of the contact holes formed in the channel protection layer 1060.

Subsequently, a CuMn thin film, a Cu thin film, and a Mo thin film are formed in this order one on top of another. Then, the source electrodes 107, 110 and the drain electrodes 108, 109 are formed by patterning, through photolithography and wet-etching. Thus, the source electrode 107 and the drain electrode 108 fill the corresponding contact holes, and thus, come in contact with the channel layer 104 at the bottom of the respective contact holes. Similarly, the source electrode 110 and the drain electrode 109 fill the corresponding contact holes, and thus, come in contact with the channel layer 105 at the bottom of the respective contact holes.

Further, the drain electrode 108 is connected to the gate electrode 102 via the contact plug 111.

(5) Forming of Lower Insulating Layer 11210, Barrier Layer 11220, and Upper Insulating Layer 11230

Figure 5A:
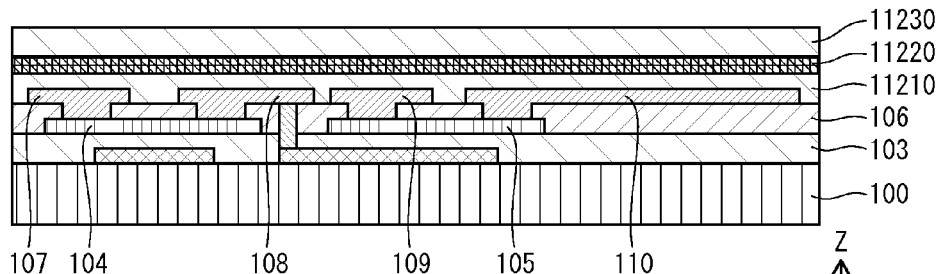

As illustrated in FIG. 5A, a lower insulating layer 11210, a barrier layer 11220, and a first upper insulating layer 11230 are formed in this order one on top of another, to cover the source electrodes 107 and 108, the drain electrodes 108 and 109, and the channel protection layer 106.

The lower insulating layer 11210 is formed by first forming a film through plasma CVD or sputtering, and then performing annealing in a dry air or oxygen atmosphere. Here, note that due to the channel layer 104 105 being placed in a vacuum during the forming of the lower insulating layer 11210, oxygen defects occur in the channel layers 104, 105, which reduces the resistance of the channel layers 104, 105. However, the annealing performed subsequent to the forming of the lower insulating layer 11210 repairs the oxygen defects and provides the channel layers 104, 105 with the desired level of resistance.

The barrier layer 11220 is formed by forming a film through CVD, ALD (atomic layer deposition), or sputtering. It is preferable that the barrier layer 11220 be formed to have a thickness of 100 nm or smaller. This is due to a greater thickness of the barrier layer 11220 results in an increase in the amount of time required for later processing. For example, in the present embodiment, the barrier layer 11220 has a thickness of 30 nm.

The first upper insulating layer 11230 is formed through plasma CVD or sputtering.

The film-forming conditions for the lower insulating layer 11210 and the first upper insulating layer 11230 in the present embodiment are provided in the following.

Figure 5B:
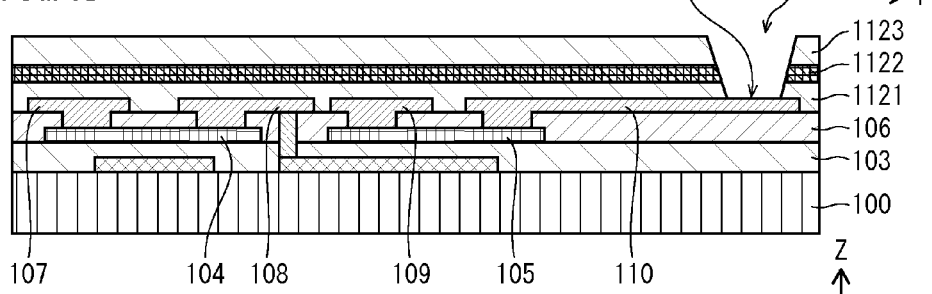

Temperature: 300 degrees Celsius
Power: 100 W
Pressure: 4 torr
$N_2O$: 1200 sccm
$SiH_4$: 16 sccm
Distance between electrodes: 550 mils (6) Forming of Contact Hole 1120a As illustrated in FIG. 5B, a contact hole 1120a is formed in a part above the source electrode 110 of a combination of the lower insulating layer 11210, the barrier layer 11220, and the first upper insulating layer 11230. The contact hole 1120a is formed to expose at the bottom thereof a surface 110a of the source electrode 110. The forming of the contract hole 1120a is performed as follows.

First, a hole is formed in the first upper insulating layer 11230 through dry etching. This hole in the first upper insulating layer 11230 exposes at the bottom thereof a surface of the barrier layer 11220. The dry etching is performed, for example, under the following conditions.

(i) First Dry Etching
$CF_4/O_2$=80/20 sccm
Pressure=13 Pa
ICP/Bias=0/300 W
Time=40 sec (OE (over etching) 50%)
(ii) Second Dry Etching
$O_2$=150 sccm
Pressure=13 Pa
ICP/Bias=500/30 W
Time=60 sec Subsequently, a hole is formed in the barrier layer 11220 through wet etching. The wet etching is performed with respect to the bottom of the hole having been formed in the first upper insulating layer 1123. The hole in the barrier layer 11220 exposes at the bottom thereof a surface of the lower insulating layer 11210. The wet etching is performed by using a PAN (phosphoric-acetic-nitric) etchant, and for a duration of 320 seconds under a temperature of 40 degrees Celsius.

Further, a hole is formed in the lower insulating layer 11210 through dry etching, which completes the forming of the contact hole 1120a. The dry etching is performed with respect to the bottom of the hole having been formed in the barrier layer 1122. The contact hole 1120a exposes at the bottom thereof the surface 110a of the source electrode 110. Here, the dry etching for forming the hole in the lower insulating layer 11210 may be performed under the same conditions as the dry etching for forming the hole in the first upper insulating layer 11230.

Thus, the contact hole 1120a is formed.

(7) Forming of Upper Electrode 113 and Second Upper Insulating Layer 11240

Figure 5C:
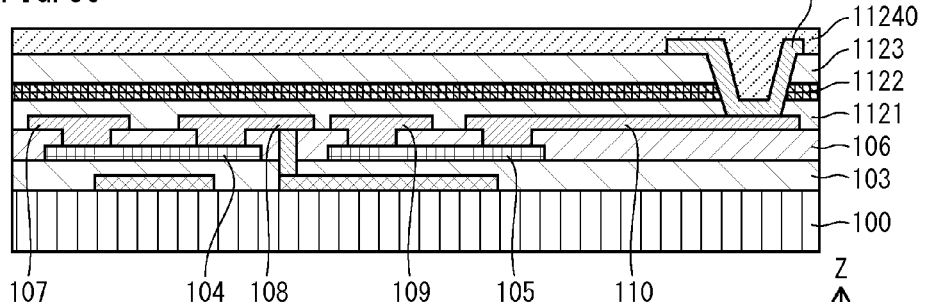

As illustrated in FIG. 5C, the upper electrode 113 is formed to extend along inner walls of the lower insulating layer 1121, the barrier layer 1122, and the first upper insulating layer 1123 that define the contact hole 1120a. A part of a top portion of the upper electrode 113 resides on the first upper insulating layer 1123. Subsequently, a second upper insulating layer 11240 is formed to cover the upper electrode 113 and the first upper insulating layer 1123.

The upper electrode 113 is formed through sputtering. In specific, the upper electrode 113 is formed by first forming a metal film, and then performing patterning through photolithography and wet etching.

Further, the second upper insulating layer 11240 is formed by depositing a SiN layer on the first upper insulating layer 1123 through plasma CVD or sputtering. The film forming conditions for the second upper insulating layer 11240 are provided in the following.

Temperature: 350 degrees Celsius
Power: 150 W
Pressure: 1.5 torr
$NH_3$: 50 sccm
$N_2$: 1000 sccm
$SiH_4$: 15 sccm
Distance between electrodes: 350 mils In the manufacturing method pertaining to the present embodiment, annealing is performed after the second upper insulating layer 11240 is formed, under a temperature lower by 50 degrees than the temperature under which the second upper insulating layer 11240 is formed (i.e., the annealing is performed under a temperature of 300 degrees Celsius). The annealing is for repairing oxygen defects in the channel layers 104, 105, which are made of an oxide semiconductor, and thereby maintaining the semiconductor characteristics of the channel layers 104, 105.

(8) Forming of Contact Hole 112a

Figure 5D:
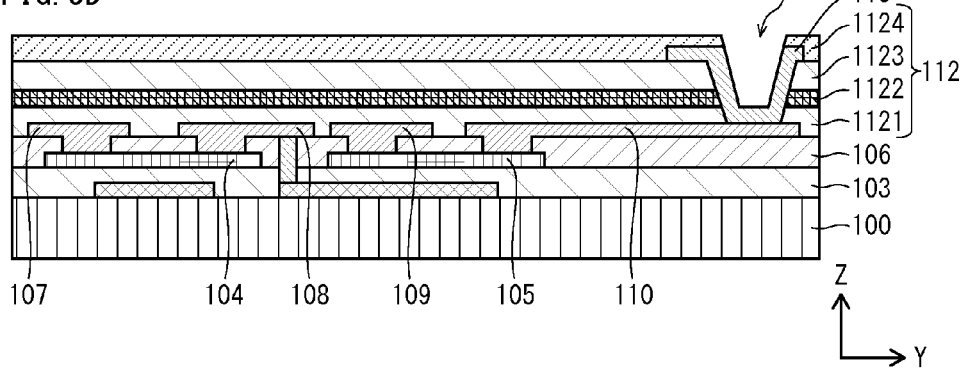

As illustrated in FIG. 5D, a contact hole 112a is formed in a part of the second upper insulating layer 11240 above the upper electrode 113. The contact hole 112a may be formed through dry etching, and for example, the dry etching may be performed under the following conditions.

(i) First Dry Etching
$CF_4/O_2$=80/20 sccm
Pressure=13 Pa
ICP/Bias=0/300 W
Time=53 sec (OE (over etching) 50%)
(ii) Second Dry Etching
$O_2$=150 sccm
Pressure=13 Pa
ICP/Bias=500/30 W
Time=60 sec Through the above procedures, forming of the passivation layer 112 with the contact hole 112a formed therein is completed. The contact hole 112a exposes therethrough an inner surface of a side wall of the upper electrode 113.

(9) Forming of Interlayer Insulating Layer 114 and Anode 115

As illustrated in FIG. 6A, the inter insulating layer 114 is formed by depositing a layer of organic material on the passivation layer 112 through application of the organic material, planarizing the surface of the layer so formed, and then forming a hole connecting with the contact hole 112a in the layer so formed.

Subsequently, the anode 115 is formed by forming a metal film covering a surface of the interlayer insulating layer 114. The metal film also covers a surface of an inner wall of the interlayer insulating layer 114 that defines the hole connecting with the contact hole 112a. The forming of the anode 115 is performed by first forming a metal film through sputtering, vapor deposition, or the like, and then performing patterning through photolithography and etching. Formed in such a manner, the anode 115 is electrically connected to the upper electrode 113.

(10) Forming of Hole Injection Layer 116 and Banks 117

As illustrated in FIG. 6A, the hole injection layer 116 is formed on the anode 115, and then, the banks 117 are formed to cover respective edges of the hole injection layer 116. The banks 117 are formed to define an opening 117a, which corresponds to one subpixel, and such that the opening 117a exposes a surface 116a of the hole injection layer 116 at the bottom thereof.

The hole injection layer 116 is formed by first forming a film made of a metal oxide (e.g., tungsten oxide) through sputtering, and then patterning the film into units each corresponding to one subpixel through photolithography and etching.

The banks 117 are formed by forming a film made of bank material (e.g., photosensitive resist material) on the hole injection layer 116 through spin-coating or the like, and then forming the opening 117a by patterning the bank material film so formed. The opening 117a is formed by disposing a mask on the bank material film, exposing the bank material film to light from above the mask, and performing developing.

(11) Forming of Hole Transport Layer 118, Light-emission Layer 119, and Electron Transport Layer 120

As illustrated in FIG. 6B, in the opening 117a defined by the banks 117, the hole transport layer 118 the light-emission layer 119, and the electron transport layer 120 are formed in this order one on top of another with the hole transport layer 118 closest to the hole injection layer 116.

The hole transport layer 118 is formed by depositing a layer of ink containing hole transport layer material inside of the opening 117a through a printing method, and then performing baking. Similarly, the light-emission layer 119 is formed by depositing a layer of ink containing light-emission layer material on the hole transport layer 118 through a printing method, and then performing baking.

(12) Forming of Cathode 121 and Sealing Layer 122

As illustrated in FIG. 6B, the cathode 121 and the sealing layer 122 are formed in this order one on top of another, to cover the electron transport layer 120 and a top part of the banks 117.

The cathode 121 and the sealing layer 122 may be formed through sputtering or the like.

Subsequently, forming of the display panel 10 is completed by disposing the substrate 126, which has the color filter layer 114 and the like formed thereon, on top of the preform composed of the layers discussed above, with the adhesion layer 123 arranged therebetween.

5. Effects

In the TFT device part in the display panel 10 pertaining to the present embodiment, the channel layers 104, 105 are made of an oxide semiconductor (IGZO). Thus, the channel layers 104, 105 achieve high electron mobility, and thus, have excellent electric characteristics. Due to this, the TFT device part is expected to achieve high electron mobility, irrespective of temperature.

In addition, in the TFT device part in the display panel 10, the passivation layer 112 is composed of the lower insulating layer 1121 (first layer) made of SiO, the barrier layer 1122 (second layer) made of AlOx, the first upper insulating layer 1123 (third layer) made of SiO, and the second upper insulating layer 1124 (fourth layer) made of SiN. Among the four layers, the barrier layer 1122 is made of aluminum oxide as discussed above. Thus, the barrier layer 1122 suppresses the entry of moisture and hydrogen (i.e., functions as a barrier), and protects (suppresses degradation of) the channel layers 104 and 105, which are made of IGZO.

Further, the lower insulating layer 1121 and the first upper insulating layer 1123, both made of SiO, are defined such that, when thermal desorption measurement is performed with respect to the lower insulating layer 1121 and the first upper insulating layer 1123, hydrogen is observed as desorption gas and within a temperature range of 300 degrees Celsius to 350 degrees Celsius, an average increase coefficient of the desorption gas does not take a positive value. Due to this, the amount of hydrogen from the lower insulating layer 1121 and the first upper insulating layer 1123 entering the channel layers 104, 105, during or after the forming of the lower insulating layer 1121 and the first upper insulating layer 1123, is reduced. Thus, degradation of the channel layers 104, 105 is suppressed, and thus, the TFT device part is ensured to have high reliability.

Similarly, the channel protection layer 106 is also defined such that, when thermal desorption measurement is performed with respect to the channel protection layer 106, hydrogen is observed as desorption gas and within a temperature range of 300 degrees Celsius to 350 degrees Celsius, an average increase coefficient of the desorption gas does not take a positive value. This also suppresses degradation of the channel layers 104, 105, and thus, the TFT device part is ensured to have high reliability.

Further, the second upper insulating layer 1124, which is made of SiN, is defined such that the Si—H density thereof is no greater than $2.3 \times 10^{21}$ cm$^{-3}$. Due to this, hydrogen from the second upper insulating layer 1124 does not affect the channel layers 104, 105 much. Thus, degradation of the channel layers 104, 105 is suppressed, and thus, the TFT device part is ensured to have high reliability.

In addition, the passivation layer 112 includes the lower insulating layer 1121, the barrier layer 1122, and the first upper insulating layer 1123, with the lower insulating layer 1121 and the first upper insulating layer 1122 sandwiching the barrier layer 1122. Thus, decrease in processing yield in forming the contact hole 112a in the passivation layer 112 is not likely to occur. Accordingly, the TFT device part pertaining to embodiment 1 achieves high manufacturing yield while suppressing the degradation of the channel layers 104 and 105, which are made of an oxide semiconductor (IGZO in the present embodiment).

6. Confirmation of Effects

The following describes the results of observations performed for confirming the effects yielded by (i) defining the channel protection layer 106, the lower insulating layer 1121, and the first upper insulating layer 1123 each as a SiO layer such that, when thermal desorption measurement is performed with respect to the SiO layer, hydrogen is observed as desorption gas and within a temperature range of 300 degrees Celsius to 350 degrees Celsius, an average increase coefficient of the desorption gas does not take a positive value, and (ii) defining the second upper insulating layer 1124 as a SiN layer whose Si—H density is no greater than $2.3 \times 10^{21}$ cm$^3$.

(1) SiN Layer

First, the effects of defining the second upper insulating layer 1124 as a SiN layer whose Si—H density is no greater than $2.3 \times 10^{21}$ cm$^{-3}$ are described, with reference to FIGS. 7A and 7B, FIG. 8, and FIGS. 9A through 9C.

(i) Si—H Density and Sheet Resistance

Samples each having the structure illustrated in FIG. 7A were prepared to confirm how the Si—H density of a SiN layer after film forming affects sheet resistance.

Each of the samples (test element group (TEG) samples) for assessing resistance, having the structure illustrated in FIG. 7A, was prepared by: (i) forming an oxide semiconductor layer made of TAOS (transparent amorphous oxide semiconductor) on a glass substrate; (ii) forming two electrodes spaced away from one another, which correspond to a pair of a source electrode and a drain electrode, on the oxide semiconductor layer; (iii) further forming a channel protection layer made of SiO on the oxide semiconductor layer; and (iv) forming a PAS1 layer made of SiO and a PAS2 layer made of SiN on the channel protection layer in this order.

FIG. 7B shows a graph whose horizontal axis shows Si—H densities of the samples after film forming, and whose vertical axis shows sheet resistance of the samples. In FIG. 7B, data indicated by a diamond corresponds to a sample without annealing, and data indicated by a square corresponds to a sample after annealing performed for one hour under a temperature of 300 degrees Celsius.

As illustrated in FIG. 7B, sheet resistance after annealing is lower than $1.0 \times 10^{8} \Omega/\square$ for Si—H densities higher than $3.2 \times 10^{21}$ cm$^{-3}$.

Further, even when taking into consideration statistical dispersion and the like, a Si—H density no greater than $2.3 \times 10^{21}$ cm$^{-3}$ achieves a high TAOS resistance of at least $1.0 \times 10^{8} \Omega/\square$, or more practically, a TAOS resistance of around $1.0 \times 10^{10} \Omega/\square$.

The following describes how sheet resistance affects threshold voltage Vth, with reference to FIG. 8. FIG. 8 illustrates the relation between the sheet resistance values and threshold voltages of samples without annealing.

As illustrated in FIG. 8, threshold voltage Vth is proportional to sheet resistance. Further, as illustrated in FIG. 8, the values of the threshold voltage Vth for sheet resistance values lower than $1.0 \times 10^8 \Omega/\square$ were smaller than zero by a considerable extent.

Note that the sheet resistance of samples whose sheet resistance was $1.0 \times 10^8 \Omega/\square$ or greater without annealing was increased to $1.0 \times 10^{10} \Omega/\square$ or greater after performing annealing for one hour under a temperature of 300 degrees Celsius. From this, it can be seen that the threshold voltages Vth of samples whose sheet resistance is $1.0 \times 10^8 \Omega/\square$ or greater without annealing can be increased to around 0 V by performing annealing.

Further, even when taking into consideration the statistical dispersion of threshold voltages Vth in the graph in FIG. 8, it can be seen that relatively small values for threshold voltage Vth correspond to sheet resistance values of $1.0 \times 10^8 \Omega/\square$ or greater, whereas relatively great values of threshold voltage Vth correspond to sheet resistance values smaller than $1.0 \times 10^8 \Omega/\square$. Thus, it can be considered that a sheet resistance of $1.0 \times 10^8 \Omega/\square$ or greater is acceptable.

(ii) Si—H Density of SiN Layer and Initial TFT Characteristics

The following explains how the Si—H density of the SiN layer in the passivation layer (i.e., one upper insulating layer) affects initial TFT characteristics, taking the above into consideration and with reference to FIGS. 9A through 9C.

As illustrated in FIG. 9A, two types of samples of TFTs (sample type 1 and sample type 2) were prepared to observe the relation between the Si—H density of the SiN layer and initial TFT characteristics. A plurality of samples were prepared for each sample type, the samples of sample type 1 and the samples of sample type 2 were prepared to basically have the identical structures, with only the characteristics of the SiN layer of the passivation layer differing therebetween. In specific, the samples of sample type 1, which is considered as a comparative example, had SiN layers having a SiN density of $3.5 \times 10^{21}$ cm$^{-3}$. Meanwhile, the samples of sample type 2, which is an implementation example of embodiment 1, had SiN layers having a SiN density of $1.3 \times 10^{21}$ cm$^{-3}$.

As illustrated in FIG. 9B, after performing annealing for one hour under a temperature of 300 degrees Celsius, the samples of sample type 1 had initial characteristics indicated by: threshold voltage Vth=−0.92 (0.49) V, $\mu_{FE}$=10.2 (1.07) cm$^2$/vs, S=0.53 (0.19) V/dec.

Meanwhile, as illustrated in FIG. 9C, after performing annealing for one hour under a temperature of 300 degrees Celsius, the samples of sample type 2 had initial characteristics indicated by: threshold voltage Vth=+0.20 (0.22) V, $\mu_{FE}$=11.5 (1.21) cm$^2$/vs, S=0.16 (0.02) V/dec.

Comparing the Vg-Id characteristics in FIGS. 9B and 9C, the samples of sample type 2 (i.e., TFT devices whose SiN layers had a Si—H density of $1.3 \times 10^{21}$ cm$^{-3}$) had initial characteristics superior to those of the samples of sample type 1.

Note that the SiN layers in sample type 1 and sample type 2 were provided with the different Si—H densities by varying the film forming conditions applied thereto as illustrated in FIG. 9A. Note that, a SiN layer with a Si—H density no greater than $2.3 \times 10^{21}$ cm$^{-3}$ may be formed with sets of film forming conditions other than the set of film forming conditions applied for sample type 2 in FIG. 9A. Naturally, forming of a SiN layer with a Si—H density no greater than $2.3 \times 10^{21}$ cm$^{-3}$ can be performed by using an appropriate or desired one of such possible sets of film forming conditions.

(2) SiO Layer

With reference to FIGS. 10A and 10B, FIGS. 11A and 11B, FIGS. 12A and 12B, FIGS. 13A through 13B, and FIGS. 14A through 14C, the following describes the effects yielded by defining the channel protection layer 106, the lower insulating layer 1121, and the first upper insulating layer 1123 each as a SiO layer such that, when thermal desorption measurement is performed with respect to the SiO layer, hydrogen is observed as desorption gas and within a temperature range of 300 degrees Celsius to 350 degrees Celsius, an average increase coefficient of the desorption gas does not take a positive value.

(i) Film Forming Conditions of SiO Layer and Spectrum of Hydrogen Desorbing from SiO in Thermal Desorption Measurement As illustrated in FIG. 10A, a plurality of samples were prepared for each of three sample types, as subjects of thermal desorption measurement for obtaining a spectrum of hydrogen released from SiO. Sample types 11 and 12 are implementation examples of embodiment 1, whereas sample type 13 is a comparative example. Further, the samples of sample types 11 through 13 were prepared by applying different film forming conditions.

With the samples of sample type 13, as illustrated in FIG. 10B, the average increase coefficients (averages of differential coefficients) of desorption gas (hydrogen) took positive values within the temperature range of 300 degrees Celsius to 350 degrees Celsius. In specific, with the samples of sample type 13, the average increase coefficients had values of approximately $1.0 \times 10^{-13}$ at 300 degrees Celsius, and the values of the average increase coefficients increased as approaching 350 degrees Celsius.

Meanwhile, with the samples of sample types 11 and 12, the average increase coefficients (averages of differential coefficients) of desorption gas (hydrogen) did not take positive values and hydrogen desorption intensity did not increase within the temperature range of 300 degrees Celsius to 350 degrees Celsius.

While the statistical dispersion of the average increase coefficients was greater for the samples of sample type 12 than for the samples of sample type 11, it still remains true that with the samples of sample type 12, the average increase coefficients (averages of differential coefficients) of desorption gas (hydrogen) did not take positive values within the temperature range of 300 degrees Celsius to 350 degrees Celsius.

From this, it can be seen that by varying film forming conditions applied to the SiO layer, the average increase coefficients of desorption gas (hydrogen) observed within the temperature range of 300 degrees Celsius to 350 degrees Celsius when performing thermal desorption measurement with respect to the SiO layer can be changed.

(ii) Initial TFT Characteristics

As illustrated in FIGS. 11A and 11B, measurement of initial characteristics was conducted with respect to sample TFT devices including lower insulating layers, first upper insulating layers, and channel protection layers made of SiO layers having the characteristics of the sample types 11, 12, and 13. In specific, FIG. 11A includes graphs indicating the initial characteristics of TFT samples including lower insulating layers, first upper insulating layers, and channel protection layers made of SiO layers corresponding to sample types 11 and 12. FIG. 11B includes graphs indicating the initial characteristics of TFT samples including lower insulating layers, first upper insulating layers, and channel protection layers made of SiO layers corresponding to sample type 13.

As illustrated in FIG. 11A, the TFT samples having SiO layers corresponding to sample types 11 and 12 indicated excellent initial characteristics. Meanwhile, as illustrated in FIG. 11B, the TFT samples having SiO layers corresponding to sample type 13 did not have the characteristics of TFTs.

(iii) Summary up to this Point

The results presented above indicate that a TFT device having excellent initial characteristics can be achieved by using, for each of the channel protection layer 106, the lower insulating layer 1121, and the first upper insulating layer 1123, a SiO layer such that, when thermal desorption measurement is performed with respect to the SiO layer, hydrogen is observed as desorption gas and within a temperature range of 300 degrees Celsius to 350 degrees Celsius, an average increase coefficient of the desorption gas does not take a positive value.

(iv) TAOS Carrier Lifetime

<Structure of Samples>

FIG. 12A illustrates the structure of samples used for measuring carrier lifetime.

As illustrated in FIG. 12A, each sample used for carrier lifetime measurement included a glass substrate, and a channel layer made of IGZO and a channel protection layer made of SiO layered in this order one on top of another on the glass substrate. Further, in each sample, the channel layer had a thickness $t_2$=30 nm, and the channel protection layer had a thickness $t_1$=240 nm.

<Carrier Lifetime>

The following explains how the term "carrier lifetime" was defined in this measurement, with reference to FIG. 12B.

For the measurement of carrier lifetime, each sample having the structure illustrated in FIG. 12A was irradiated with a microwave having the frequency of 26 GHz, and the reflectance (base intensity) from the sample was measured as reflection intensity $I_1$.

At the same time each sample was irradiated with the microwave, the sample was also irradiated with an ultraviolet pulse laser. The irradiation with the ultraviolet pulse laser was performed under the following conditions.

YLF-3HG Laser

λ=349 nm pulse interval; 15 nsec

Measurement was performed of microwave reflectance of each sample, as reflection intensity $I_2$. Further, the difference between reflection intensity $I_2$ and reflection intensity $I_1$ ($I_2-I_1$) was calculated, and a graph as illustrated in FIG. 12B including a curve indicating the chronological change of the difference ($I_2-I_1$) was created.

In this measurement, the decay constant (the amount of time between time $P_1$ corresponding to the reflectance peak and time point $P^2$ corresponding to reflectance 1/e) in the curve illustrated in FIG. 12B was defined as a carrier lifetime T (1/e lifetime).

Note that assumption can be made that longer the carrier lifetime T, the smaller the number of trapping centers and recombination centers at the interface between the channel protection layer and the channel layer.

<Film Forming Rate, Refractive Index, and Carrier Lifetime T>

As illustrated in FIG. 13A, a plurality of samples were prepared for each of four sample types, namely sample types 21 through 24. Samples of one sample type were prepared with film forming conditions differing from those for samples of the rest of the sample types.

As illustrated in FIG. 13B, the film forming rates for the samples of sample type 21 (indicated by "S21" in FIG. 13B) and samples of sample type 23 (indicated by "S23" in FIG. 13B) were within the range between 50 nm/sec and 110 nm/sec. Meanwhile, the film forming rates for samples of sample type 22 (indicated by "S22" in FIG. 13B) was 150 nm/sec, and the film forming rates for samples of sample type 24 (indicated by "S24" in FIG. 13B) were 200 nm/sec. Among such samples, the carrier lifetimes T for samples of sample type 23, whose film forming rates were within the range between 50 nm/sec and 110 nm/sec, were excellent, being $3.0\times10^{-2}$ μsec or longer.

Further, when assessing the respective carrier lifetimes T for sample types 21 through 24 in terms of refractive index as illustrated in FIG. 13C, samples of sample type 23 (indicated by "S23" in FIG. 13C), whose refractive indexes were within a range between 1.454 and 1.461, had carrier lifetimes T of $3.0\times10^{-2}$ μsec or longer, which are superior to the carrier lifetimes T for the samples of sample types 21, 22, and 24.

(v) Initial TFT Characteristics

FIGS. 14A through 14C illustrate initial characteristics of TFT samples including lower insulating layers, first upper insulating layers, and channel protection layers made of SiO layers having the characteristics of the sample types 21, 22, and 23. However, a great shift of threshold voltage Vth was observed with TFT samples including SiO layers having the characteristics of sample type 24. Thus, Vg-Id graphs for such samples are not illustrated in particular.

As illustrated in FIG. 14A, TFT samples including SiO layers of sample type 21, whose carrier lifetimes T (1/e lifetime) were shorter than $3.0\times10^2$ μsec, had initial characteristics indicated by: threshold voltage Vth=−0.95 (0.34) V, $\mu_{FE}$=11.1 (1.02) cm$^2$/vs, S=0.46 (0.08) V/dec. Further, as illustrated in FIG. 14B, TFT samples including SiO layers of sample type 22, whose carrier lifetimes T (1/e lifetime) were also shorter than $3.0\times10^{-2}$ μsec, had initial characteristics indicated by: threshold voltage Vth=−0.92 (0.49) V, $\mu_{FE}$=10.2 (1.07) cm$^2$/vs, S=0.53 (0.19) V/dec.

Meanwhile, as illustrated in FIG. 14C, TFT samples including SiO layers of sample type 23, whose carrier lifetimes T (1/e lifetime) were $3.0\times10^{-2}$ μsec or longer, had initial characteristics indicated by: threshold voltage Vth=+0.20 (0.22) V, $\mu^{FE}$=11.5 (1.21) cm$^2$/vs, S=0.16 (0.02) V/dec.

Accordingly, TFT devices including SiO layers of sample type 23, whose film forming rates were within the range between 50 nm/sec and 110 nm/sec and whose refractive indexes were within the range between 1.454 and 1.461, had carrier lifetimes T (1/e lifetimes) of $3.0\times10^{-2}$ μsec or longer and thus, had better TFT characteristics than TFT devices including SiO layers of sample types 21, 22, 24.

(3) Conclusion

Combining the measurement results discussed above, FIG. 15A illustrates the characteristics of the TFT device pertaining to the present embodiment, and FIG. 15B illustrates the characteristics of a TFT device pertaining to a comparative example. Note that the measurement in FIGS. 15A and 15B were performed under a temperature of 90 degrees Celsius, and with TFT devices with a width of 50 μm and a length of 10 μm.

As illustrated in FIG. 15A, the threshold voltage shift ΔVth with the TFT device pertaining to the present embodiment was −0.20 V, which is extremely small. As already described above, the TFT device pertaining to the present embodiment is characterized for (i) the channel protection layer 106, the lower insulating layer 1121, and the first upper insulating layer 1123 each being a SiO layer such that, when thermal desorption measurement is performed with respect to the SiO layer, hydrogen is observed as desorption gas and within a temperature range of 300 degrees Celsius to 350 degrees Celsius, an average increase coefficient of the desorption gas does not take a positive value, and (ii) the second upper insulating layer 1124 being a SiN layer whose Si—H density is no greater than $2.3 \times 10^{21}$ cm$^{-3}$.

Meanwhile, as illustrated in FIG. 15B, the threshold voltage shift ΔVth with the TFT device pertaining to the comparative example, whose channel protection layer and passivation layer had characteristics differing from those of the channel protection layer and the passivation layer included in the TFT device pertaining to the present embodiment, was −5.68 V and thus was greater than that with the TFT device pertaining to the present embodiment.

As such, a TFT device including SiO layers and a SiN layer having the above characteristics, one example of which is the TFT device part pertaining to the present embodiment, exhibits excellent characteristics in NBTS measurement.

Embodiment 2

The following describes a display panel 30 pertaining to embodiment 2, with reference to FIG. 16. Note that FIG. 16 only provides structural illustration of some parts (mainly, the structure of the TFT device part) of the display panel 30. Parts of the display panel 30 not illustrated in FIG. 16 have the same structures as the corresponding parts of the display panel 10 pertaining to embodiment 1, and are provided with the same reference signs as those provided to the corresponding parts of the display panel 10.

As illustrated in FIG. 16, the display panel 30 includes an interlayer insulating layer 327 covering the source electrodes 107 and 110, the drain electrodes 108 and 109, and the channel protection layer 106, and a passivation layer 312 disposed on the interlayer insulating layer 327. Further, the display panel 30 includes an upper electrode 313. The upper electrode 313 extends along an inner wall of the interlayer insulating layer 327 defining a contact hole formed in the interlayer insulating layer 327 and is connected to the source electrode 110. Further, a part of a top portion of the upper electrode 313 is sandwiched between the interlayer insulating layer 327 and a lower insulating layer 3121 of the passivation layer 312.

In embodiment 2, the passivation layer 312 is composed of the lower insulating layer 3121 made of SiO, a barrier layer 3122 made of an aluminum compound (e.g., aluminum oxide), and an upper insulating layer 3123 made of SiN disposed in this order one on top of another with the lower insulating layer 3123 lowermost in the Z axis direction.

Further, an anode 315 is disposed above the passivation layer 312, with an interlayer insulating layer 314 residing between the anode 315 and the passivation 312 at certain areas. The anode 315 is electrically connected to the upper electrode 313 at the bottom of a contact hole penetrating through the interlayer insulating layer 314 and the passivation layer 312.

Similar to the above, in the TFT device part in the display panel 30 pertaining to the present embodiment, (i) the channel protection layer 106 and the lower insulating layer 3121 of the passivation layer 312 each are a SiO layer such that, when thermal desorption measurement is performed with respect to the SiO layer, hydrogen is observed as desorption gas and within a temperature range of 300 degrees Celsius to 350 degrees Celsius, an average increase coefficient of the desorption gas does not take a positive value, and (ii) the upper insulating layer 3123 is a SiN layer whose Si—H density is no greater than $2.3 \times 10^{21}$ cm$^{-3}$. Thus, the TFT device part in the display panel 30 also achieves excellent TFT characteristics.

Similar to the above, in the TFT device part in the display panel 30 pertaining to the present embodiment, the channel layers 104, 105 are made of an oxide semiconductor (IGZO). Thus, the channel layers 104, 105 achieve high electron mobility, and thus, have excellent electric characteristics. Due to this, the TFT device part is expected to achieve high electron mobility, irrespective of temperature.

In addition, similar to embodiment 1, in the TFT device part in the display panel 30, the passivation layer 312 includes the barrier layer 3122, which is made of an aluminum compound (e.g., AlOx). The barrier layer 3122 suppresses the entry of moisture and hydrogen (i.e., functions as a barrier), and protects (suppresses degradation of) the channel layers 104 and 105, which are made of IGZO.

Thus, the TFT device part pertaining to the present embodiment, as well as a display device including the TFT device part, has high stability and reliability.

Embodiment 3

The following describes a display panel 40 pertaining to embodiment 3, with reference to FIG. 17. Note that FIG. 17 only provides structural illustration of some parts (mainly, the structure of the TFT device part) of the display panel 40. Parts of the display panel 40 not illustrated in FIG. 17 have the same structures as the corresponding parts of the display panel 10 pertaining to embodiment 1, and are provided with the same reference signs as those provided to the corresponding parts of the display panel 10.

As illustrated in FIG. 17, the display panel 40 pertaining to the present embodiment includes a passivation layer 412 covering the source electrodes 107 and 110, the drain electrodes 108 and 109, and the channel protection layer 106. The passivation layer 412 is composed of five layers. In specific, the passivation layer 412 is composed of: a lower insulating layer 4121 made of SiO; a barrier layer 4122 made of an aluminum compound (e.g., AlOx); a first upper insulating layer 4123 made of SiO; a second upper insulating layer 4124 made of SiN; and a third upper insulating layer 4125 made of SiN, layered in this order one on top of another with the lower insulating layer 4121 lowermost in the Z axis direction.

Similar to embodiment 1, in the TFT device part in the display panel 40 pertaining to the present embodiment, (i) the channel protection layer 106, and the lower insulating layer 4121 and the first upper insulating layer 4123 of the passivation layer 412 each are a SiO layer such that, when thermal desorption measurement is performed with respect to the SiO layer, hydrogen is observed as desorption gas and within a temperature range of 300 degrees Celsius to 350 degrees Celsius, an average increase coefficient of the desorption gas does not take a positive value, and (ii) the second upper insulating layer 4124 and the third upper insulating layer 4125 each are a SiN layer whose Si—H density is no greater than $2.3 \times 10^{21}$ cm$^{-3}$.

Further, the display panel 40 includes an upper electrode 413 extending along inner walls of the lower insulating layer 4121, the barrier layer 4122, the first upper insulating layer 4123, and the second upper insulating layer 4124 defining a contact hole penetrating through the lower insulating layer 4121, the barrier layer 4122, the first upper insulating layer 4123, and the second upper insulating layer 4124. Further, a part of a top portion of the upper electrode 413 is sandwiched between the second upper insulating layer 4124 and the third upper insulating layer 4125.

Further, an anode 415 is formed above the passivation layer 412, with an interlayer insulating layer 414 therebetween at certain areas. The anode 415 is electrically connected to the upper electrode 413, at the bottom of a contact hole penetrating through the interlayer insulating layer 414 and the third upper insulating layer 4125.

Similar to the TFT device part pertaining to embodiment 1, the TFT device part pertaining to the present embodiment also achieves excellent TFT characteristics for the channel protection layer 106 and certain layers of the passivation layer 412 being a SiO layer/SiN layer having the same characteristics as in embodiment 1. Further, due to the passivation layer 412 including two SiO layers and two SiN layers, the TFT device part pertaining to the present embodiment has even higher reliability than those in embodiments 1 and 2.

Further, similar to the above, in the TFT device part in the display panel 40 pertaining to the present embodiment, the channel layers 104, 105 are made of an oxide semiconductor (IGZO). Thus, the channel layers 104, 105 achieve high electron mobility, and thus, have excellent electric characteristics. Due to this, the TFT device part is expected to achieve high electron mobility, irrespective of temperature.

In addition, similar to the above, in the TFT device part in the display panel 40, the passivation layer 412 includes the barrier layer 4122, which is made of an aluminum compound (e.g., AlOx). The barrier layer 4122 suppresses the entry of moisture and hydrogen (i.e., functions as a barrier), and protects (suppresses degradation of) the channel layers 104 and 105, which are made of IGZO.

Thus, the TFT device part pertaining to the present embodiment, as well as a display device including the TFT device part, has high stability and reliability.

Embodiment 4

The following describes a display panel 50 pertaining to embodiment 4, with reference to FIG. 18. Note that FIG. 18 only provides structural illustration of some parts (mainly, the structure of the TFT device part) of the display panel 50. Parts of the display panel 50 not illustrated in FIG. 18 have the same structures as the corresponding parts of the display panel 10 pertaining to embodiment 1, and are provided with the same reference signs as those provided to the corresponding parts of the display panel 10.

As illustrated in FIG. 18, the display panel 50 pertaining to the present embodiment includes a passivation layer 512 covering the source electrodes 107 and 110, the drain electrodes 108 and 109, and the channel protection layer 106. The passivation layer 512 is composed of four layers. In specific, the passivation layer 512 is composed of: a lower insulating layer 5121 made of SiO; a barrier layer 5122 made of an aluminum compound (e.g., AlOx); a first upper insulating layer 5123 made of SiN; and a second upper insulating layer 5124 made of SiN, layered in this order one on top of another with the lower insulating layer 5121 lowermost in the Z axis direction.

Similar to the above, in the TFT device part in the display panel 50 pertaining to the present embodiment, (i) the channel protection layer 106 and the lower insulating layer 5121 of the passivation layer 512 each are a SiO layer such that, when thermal desorption measurement is performed with respect to the SiO layer, hydrogen is observed as desorption gas and within a temperature range of 300 degrees Celsius to 350 degrees Celsius, an average increase coefficient of the desorption gas does not take a positive value, and (ii) the first upper insulating layer 5123 and the second upper insulating layer 5124 each are a SiN layer whose Si—H density is no greater than $2.3 \times 10^{21}$ cm$^3$.

Further, in the TFT device part pertaining to the present embodiment, the second upper insulating layer 5124 has lower density than the first upper insulating layer 5123. This facilitates forming a contact hole with a tapered shape; and Further, the display panel 50 includes an upper electrode 513 extending along inner walls of the lower insulating layer 5121, the barrier layer 5122, and the first upper insulating layer 5123 defining a contact hole penetrating through the lower insulating layer 5121, the barrier layer 5122, and the first upper insulating layer 5123. Further, a part of a top portion of the upper electrode 513 is sandwiched between the first upper insulating layer 5123 and the second upper insulating layer 5124.

Further, an anode 515 is disposed above the passivation layer 512, with an interlayer insulating layer 514 therebetween at certain areas. Electrical connection similar to the above is formed between the anode 515 and the upper electrode 513.

Similar to the TFT device part pertaining to embodiment 1, the TFT device part pertaining to the present embodiment also achieves excellent TFT characteristics for the channel protection layer 106 and certain layers of the passivation layer 512 being a SiO layer/SiN layer having the same characteristics as in embodiment 1.

Further, similar to the above, in the TFT device part in the display panel 50 pertaining to the present embodiment, the channel layers 104, 105 are made of an oxide semiconductor (IGZO). Thus, the channel layers 104, 105 achieve high electron mobility, and thus, have excellent electric characteristics. Due to this, the TFT device part is expected to achieve high electron mobility, irrespective of temperature.

In addition, similar to the above, in the TFT device part in the display panel 50, the passivation layer 512 includes the barrier layer 5122, which is made of an aluminum compound (e.g., AlOx). The barrier layer 5122 suppresses the entry of moisture and hydrogen (i.e., functions as a barrier), and protects (suppresses degradation of) the channel layers 104 and 105, which are made of IGZO.

Thus, the TFT device part pertaining to the present embodiment, as well as a display device including the TFT device part, has high stability and reliability.

Embodiment 5

The following describes a display panel 60 pertaining to embodiment 5, with reference to FIG. 19. Note that FIG. 19 only provides structural illustration of some parts (mainly, the structure of the TFT device part) of the display panel 60. Parts of the display panel 60 not illustrated in FIG. 19 have the same structures as the corresponding parts of the display panel 10 pertaining to embodiment 1, and are provided with the same reference signs as those provided to the corresponding parts of the display panel 10.

As illustrated in FIG. 19, the display panel 60 pertaining to the present embodiment includes a passivation layer 612 covering the source electrodes 107 and 110, the drain electrodes 108 and 109, and the channel protection layer 106. The passivation layer 612 is composed of two layers. In specific, the passivation layer 612 is composed of: a lower insulating layer 6121 made of SiO; and a barrier layer 6122 made of an aluminum compound (e.g., AlOx), layered in this order one on top of another with the lower insulating layer 6121 lower in the Z axis direction.

Similar to the above, in the TFT device part in the display panel 60 pertaining to the present embodiment, the channel protection layer 106 and the lower insulating layer 6121 of the passivation layer 612 each are a SiO layer such that, when thermal desorption measurement is performed with respect to the SiO layer, hydrogen is observed as desorption gas and within a temperature range of 300 degrees Celsius to 350 degrees Celsius, an average increase coefficient of the desorption gas does not take a positive value.

Further, the display panel 60 includes an upper electrode 613 extending along an inner wall of the lower insulating layer 6121 defining a contact hole penetrating through the lower insulating layer 6121. Further, a part of a top portion of the upper electrode 613 is sandwiched between the lower insulating layer 6121 and the barrier layer 6122.

Further, an anode 615 is disposed above the passivation layer 612, with an interlayer insulating layer 614 therebetween at certain areas. The anode 615 is electrically connected to the upper electrode 613, at the bottom of a contact hole penetrating through the interlayer insulating layer 614 and the barrier layer 6122.

While the passivation layer 612 in the TFT device part pertaining to the present embodiment does not include an SiN layer, the TFT device part pertaining to the present embodiment also achieves excellent TFT characteristics, similar to the TFT device part pertaining to embodiment 1, for the channel protection layer 106 and the lower insulating layer 6121 of the passivation layer 612 being SiO layers having the same characteristics as in embodiment 1. Further, similar to the above, in the TFT device part in the display panel 60 pertaining to the present embodiment, the channel layers 104, 105 are made of an oxide semiconductor (IGZO). Thus, the channel layers 104, 105 achieve high electron mobility, and thus, have excellent electric characteristics. Due to this, the TFT device part is expected to achieve high electron mobility, irrespective of temperature.

In addition, similar to the above, in the TFT device part in the display panel 60, the passivation layer 612 includes the barrier layer 6122, which is made of an aluminum compound (e.g., AlOx). The barrier layer 6122 suppresses the entry of moisture and hydrogen (i.e., functions as a barrier), and protects (suppresses degradation of) the channel layers 104 and 105, which are made of IGZO.

Thus, the TFT device part pertaining to the present embodiment, as well as a display device including the TFT device part, has high stability and reliability.

Embodiment 6

The following describes a display panel 70 pertaining to embodiment 6, with reference to FIG. 20. Note that FIG. 20 only provides structural illustration of some parts (mainly, the structure of the TFT device part) of the display panel 70. Parts of the display panel 70 not illustrated in FIG. 20 have the same structures as the corresponding parts of the display panel 10 pertaining to embodiment 1, and are provided with the same reference signs as those provided to the corresponding parts of the display panel 10.

As illustrated in FIG. 20, the display panel 70 pertaining to the present embodiment includes a passivation layer 712 covering the source electrodes 107 and 110, the drain electrodes 108 and 109, and the channel protection layer 106. The passivation layer 712 is similar to the passivation layer 512 for being composed of four layers, but the structure of the passivation layer 712 differs from the structure of the passivation layer 512 in detail.

In specific, the passivation layer 712 is composed of: a first lower insulating layer 7121 made of SiO; a second lower insulating layer 7123 made of SiN; a third lower insulating layer 7124 made of SiN; and a barrier layer 7122 made of an aluminum compound (e.g., AlOx), layered in this order one on top of another with the barrier layer 7122 uppermost in the Z axis direction.

Similar to the above, in the TFT device part in the display panel 70 pertaining to the present embodiment, (i) the channel protection layer 106 and the first lower insulating layer 7121 of the passivation layer 712 each are a SiO layer such that, when thermal desorption measurement is performed with respect to the SiO layer, hydrogen is observed as desorption gas and within a temperature range of 300 degrees Celsius to 350 degrees Celsius, an average increase coefficient of the desorption gas does not take a positive value, and (ii) the second lower insulating layer 7123 and the third lower insulating layer 7124 each are a SiN layer whose Si—H density is no greater than $2.3 \times 10^{21}$ cm$^{-3}$.

Further, the display panel 70 includes an upper electrode 713 extending along inner walls of the first lower insulating layer 7121, and the second lower insulating layer 7123 defining a contact hole penetrating through the first lower insulating layer 7121 and the second lower insulating layer 7123. Further, a part of a top portion of the upper electrode 713 is sandwiched between the second lower insulating layer 7123 and the third lower insulating layer 7124.

Further, an anode 715 is disposed above the passivation layer 712, with an interlayer insulating layer 714 therebetween at certain areas. Electrical connection similar to the above is formed between the anode 715 and the upper electrode 713.

Similar to the TFT device part pertaining to embodiment 1, the TFT device part pertaining to the present embodiment also achieves excellent TFT characteristics for the channel protection layer 106 and certain layers of the passivation layer 712 being a SiO layer/SiN layer having the same characteristics as in embodiment 1.

Further, similar to the above, in the TFT device part in the display panel 70 pertaining to the present embodiment, the channel layers 104, 105 are made of an oxide semiconductor (IGZO). Thus, the channel layers 104, 105 achieve high electron mobility, and thus, have excellent electric characteristics. Due to this, the TFT device part is expected to achieve high electron mobility, irrespective of temperature.

In addition, similar to the above, in the TFT device part in the display panel 70, the passivation layer 712 includes the barrier layer 7122, which is made of an aluminum compound (e.g., AlOx). The barrier layer 7122 suppresses the entry of moisture and hydrogen (i.e., functions as a barrier), and protects (suppresses degradation of) the channel layers 104 and 105, which are made of IGZO.

Thus, the TFT device part pertaining to the present embodiment, as well as a display device including the TFT device part, has high stability and reliability.

Embodiment 7

The following describes a display panel 80 pertaining to embodiment 7, with reference to FIG. 21. Note that FIG. 21 only provides structural illustration of some parts (mainly, the structure of the TFT device part) of the display panel 80. Parts of the display panel 80 not illustrated in FIG. 21 have the same structures as the corresponding parts of the display panel 10 pertaining to embodiment 1, and are provided with the same reference signs as those provided to the corresponding parts of the display panel 10.

As illustrated in FIG. 21, the display panel 80 pertaining to the present embodiment includes a passivation layer 812 covering the source electrodes 107 and 110, the drain electrodes 108 and 109, and the channel protection layer 106. The passivation layer 812 is composed of two layers. In specific, the passivation layer 812 is composed of: a lower insulating layer 8121 made of SiO; and an upper insulating layer 8123 made of SiN, layered in this order one on top of another with the lower insulating layer 8121 lower in the Z axis direction.

Similar to the above, in the TFT device part in the display panel 80 pertaining to the present embodiment: (i) the channel protection layer 106 and the lower insulating layer 8121 of the passivation layer 812 each are a SiO layer such that, when thermal desorption measurement is performed with respect to the SiO layer, hydrogen is observed as desorption gas and within a temperature range of 300 degrees Celsius to 350 degrees Celsius, an average increase coefficient of the desorption gas does not take a positive value; and (ii) the upper insulating layer 8123 is a SiN layer whose Si—H density is no greater than $2.3 \times 10^{21}$ cm$^{-3}$.

Further, the display panel 80 includes an upper electrode 813 extending along an inner wall of the hole insulating layer 8121 defining a contact hole penetrating through the lower insulating layer 8121. Further, a part of a top portion of the upper electrode 813 is sandwiched between the lower insulating layer 8121 and the upper insulating layer 8123.

Further, an anode 815 is disposed above the passivation layer 812, with an interlayer insulating layer 814 therebetween at certain areas. Electrical connection similar to the above is formed between the anode 815 and the upper electrode 813.

Similar to the TFT device part pertaining to embodiment 1, the TFT device part pertaining to the present embodiment also achieves excellent TFT characteristics for the channel protection layer 106 and certain layers of the passivation layer 812 being a SiO layer/SiN layer having the same characteristics as in embodiment 1.

Further, similar to the above, in the TFT device part in the display panel 80 pertaining to the present embodiment, the channel layers 104, 105 are made of an oxide semiconductor (IGZO). Thus, the channel layers 104, 105 achieve high electron mobility, and thus, have excellent electric characteristics. Due to this, the TFT device part is expected to achieve high electron mobility, irrespective of temperature.

In addition, in the present embodiment, the passivation layer 812 is composed of the lower insulating layer 8121 made of SiO and the upper insulating layer 8123 made of SiN. Thus, the passivation layer 812 only includes a small number of layers, which reduces the number of procedures in manufacturing. Further, the passivation layer 812 does not include a barrier layer made of AlOx. This is advantageous in terms of manufacturing, since forming a contact hole in a barrier layer made of AlOx is difficult.

Thus, the TFT device part pertaining to the present embodiment, as well as a display device including the TFT device part, has high stability and reliability.

Embodiment 8

The following describes a display panel 90 pertaining to embodiment 8, with reference to FIG. 22. Note that FIG. 22 only provides structural illustration of some parts (mainly, the structure of the TFT device part) of the display panel 90. Parts of the display panel 90 not illustrated in FIG. 22 have the same structures as the corresponding parts of the display panel 10 pertaining to embodiment 1, and are provided with the same reference signs as those provided to the corresponding parts of the display panel 10.

As illustrated in FIG. 22, the display panel 90 pertaining to the present embodiment includes a passivation layer 912 covering the source electrodes 107 and 110, the drain electrodes 108 and 109, and the channel protection layer 106. The passivation layer 912 is composed of three layers. In specific, the passivation layer 912 is composed of: a lower insulating layer 9121 made of SiO; a first upper insulating layer 9123 made of SiN; and a second upper insulating layer 9124 made of SiN, layered in this order one on top of another with the lower insulating layer 9121 lowermost in the Z axis direction.

Similar to the above, in the TFT device part in the display panel 90 pertaining to the present embodiment: (i) the channel protection layer 106 and the lower insulating layer 9121 of the passivation layer 912 each are a SiO layer such that, when thermal desorption measurement is performed with respect to the SiO layer, hydrogen is observed as desorption gas and within a temperature range of 300 degrees Celsius to 350 degrees Celsius, an average increase coefficient of the desorption gas does not take a positive value; and (ii) the first upper insulating layer 9123 and the second upper insulating layer 9124 each are a SiN layer whose Si—H density is no greater than $2.3 \times 10^{21}$ cm$^{-3}$.

Further, in the TFT device part pertaining to the present embodiment, the second upper insulating layer 9124 has lower density than the first upper insulating layer 9123. This facilitates forming a contact hole with a tapered shape.

Further, the display panel 90 includes an upper electrode 913 extending along inner walls of the lower insulating layer 9121 and the first upper insulating layer 9123 defining a contact hole penetrating through the lower insulating layer 9121 and the first upper insulating layer 9123. Further, a part of a top portion of the upper electrode 913 is sandwiched between the first upper insulating layer 9123 and the second upper insulating layer 9124.

Further, an anode 915 is disposed above the passivation layer 912, with an interlayer insulating layer 914 therebetween at certain areas. Electrical connection similar to the above is formed between the anode 915 and the upper electrode 913.

Similar to the TFT device part pertaining to embodiment 1, the TFT device part pertaining to the present embodiment also achieves excellent TFT characteristics for the channel protection layer 106 and certain layers of the passivation layer 912 being a SiO layer/SiN layer having the same characteristics as in embodiment 1. In addition, in the present embodiment, two upper insulating layers made of SiN (i.e., the first upper insulating layer 9123 and the second upper insulating layer 9124) are disposed on the lower insulating layer 9121 made of SiO, above the channel protection layer 106 with the lower insulating layer 9121 therebetween. The first upper insulating layer 9123 and the second upper insulating layer 9124 form a dense film suppressing the entry of moisture and hydrogen and thereby protecting the channel layers 104 and 105.

Further, similar to the above, in the TFT device part in the display panel 90 pertaining to the present embodiment, the channel layers 104, 105 are made of an oxide semiconductor (IGZO). Thus, the channel layers 104, 105 achieve high electron mobility, and thus, have excellent electric characteristics. Due to this, the TFT device part is expected to achieve high electron mobility, irrespective of temperature.

Further, in the present embodiment, the passivation layer 912 does not include a barrier layer made of AlOx. This is advantageous in terms of manufacturing, or more specifically, in the forming of a contact hole, for example.

Thus, the TFT device part pertaining to the present embodiment, as well as a display device including the TFT device part, has high stability and reliability.

[Other Matters]

In embodiments 1 through 8, the passivation layer is composed of two to five layers. Nevertheless, the passivation layer may be composed of a single layer, or may be composed of six or more layers.

Further, when the passivation layer is composed of two or more layers, whether or not to provide the passivation layer with a barrier layer made of an aluminum compound may be determined as necessary, as long as the passivation layer includes at least one of a SiO layer and a SiN layer.

Further, the passivation layer may include a SiON layer in place of a SiO layer, or a SiON layer in place of a SiN layer. When making this modification, a SiON layer replacing a SiO layer is to satisfy the above-described requirements of an SiO layer (i.e., the requirements related to an average increase coefficient of the desorption gas (hydrogen) when thermal desorption measurement is performed), and a SiON layer replacing a SiN layer is to satisfy the above-described requirement of an SiN layer (i.e., the requirements related to the Si—H density).

Further, the channel protection layer need not be a single layer made of SiO. That is, the channel protection layer made by composed of two layers, one made of SiO and the other made of SiN, or three or more layers including a SiO layer and a SiN layer. When making this modification, a SiO layer in the channel protection layer is to satisfy the above-described requirements of an SiO layer (i.e., the requirements related to an average increase coefficient of the desorption gas (hydrogen) when thermal desorption measurement is performed), and a SiN layer in the channel protection layer is to satisfy the above-described requirement of an SiN layer (i.e., the requirements related to the Si—H density). Thus, the same effects as described above can be achieved. Further, when including a SiN layer in the channel protection layer, it is preferable that the SiN layer be spaced away from the channel layers with the SiO layer of the channel protection layer between the SiN layer of the channel protection layer and the channel layers. A channel protection layer with this structure prevents hydrogen from arriving at the channel layers to a further extent.

Each of embodiments 1 through 8 describes a bottom gate (inverse-staggered) TFT device. Meanwhile, the technology pertaining to the present disclosure is also applicable to top gate (staggered) TFT devices. This achieves the same effects as described above.

Each of embodiments 1 through 8 describes an EL display panel of the top-emission type as an example of a display panel. However, the technology pertaining to the present disclosure is not only applicable to top-emission type EL display panels. That is, the technology pertaining to the present disclosure is also applicable to bottom-emission type display panels, and also, to liquid crystal panels, field emission display panels, electronic papers, and the like.

Each of embodiments 1 through 8 describes a configuration where two transistor elements ($Tr_1$, $Tr_2$) are provided for each subpixel 10a. However, the technology pertaining to the present disclosure is not only applicable to such a configuration. That is, the technology pertaining to the present disclosure is also applicable, for example, to a configuration where only one transistor element is provided for each subpixel, or a configuration where three or more transistor elements are provided for each subpixel.

Further, each constituent element may be formed by using any suitable material. For example, the barrier layer of the passivation layer need not be made of AlOx, and instead, may be made of a nitride containing Al, or an oxynitride containing Al.

Further, the gate electrodes, source electrodes, and drain electrodes need not have the structures described above. For example, each of such electrodes may be composed of a combination of a Mo layer and an Al layer, or a combination of a Mo layer and a metal alloy layer made of Al and Nd.

Further, each of embodiments 1 through 8 describes a configuration where an anode (115, 315, 415, 515, 615, 715, 815, 915) is located at a bottom portion of the EL element part, and the anode is connected to the source electrode 110 of the TFT device part. However, the technology pertaining to the present disclosure is not only applicable to such a configuration. That is, the technology pertaining to the present disclosure is applicable to a configuration where a cathode is provided at the bottom portion of the EL element part, and an anode is provided at the top portion of the EL element part. With such a configuration, the cathode at the bottom portion of the EL element part is connected to a drain of the TFT device part.

In addition, any suitable known material may be used for any of the constituent elements.

INDUSTRIAL APPLICABILITY

The technology pertaining to the present disclosure is useful for realizing a thin film transistor device that has excellent electrical characteristics.

REFERENCE SIGNS LIST

1 Display device
10, 30, 40, 50, 60, 70, 80, 90 Display panel
10a Subpixel
20 Drive/control circuit
21-24 Drive circuit
25 Control circuit
100, 126 Substrate
101, 102 Gate electrode
103, 1030 Gate insulating layer
104, 105 Channel layer
106, 1060 Channel protection layer
107, 110 Source electrode
108, 109 Drain electrode
111 Contact plug
112, 312, 412, 512, 612, 712, 812, 912 Passivation layer
113, 313, 413, 513, 613, 713, 813, 913 Upper electrode
114, 314, 327, 414, 514, 614, 714, 814, 914 Interlayer insulating layer
115, 315, 415, 515, 615, 715, 815, 915 Anode
116 Hole injection layer
117 Bank
118 Hole transport layer
119 Light-emitting layer
120 Electron transport layer
121 Cathode
122 Sealing layer
123 Adhesion layer
124 Color filter layer
125 Light-blocking layer
1121, 3121, 4121, 5121, 6121, 7121, 7123, 7124, 8121, 9121, 11210 Lower insulating layer 1122, 3122, 4122, 5122, 6122, 7122, 11220 Barrier layer
1123, 1124, 3123, 4123, 4124, 4125, 5123, 5124, 8123, 9123, 9124, 11230, 11240 Upper insulating layer

The invention claimed is:

1. A thin film transistor device comprising:
a substrate;
a gate electrode above the substrate;
a channel layer above the gate electrode;
a channel protection layer on the channel layer;
an electrode pair on the channel protection layer, the electrode pair composed of a source electrode and a drain electrode that are spaced away from one another, a part of each of the source electrode and the drain electrode in contact with the channel layer through the channel protection layer; and
a passivation layer extending over the gate electrode, the channel layer, the electrode pair, and the channel protection layer, wherein
the channel layer is made of an oxide semiconductor, and
the thin film transistor device has a first sub-layer which is made of one of silicon nitride and silicon oxynitride and in which a density of H atoms bonded with Si atoms is no greater than $2.3\times10^{21}$ cm$^{-3}$, the first sub-layer included in at least one of the channel protection layer and the passivation layer.

2. The thin film transistor device of claim 1, wherein in the first sub-layer, the density of H atoms bonded with Si atoms is no greater than $1.3\times10^{21}$ cm$^{-3}$.

3. The thin film transistor device of claim 1, wherein the thin film transistor device has a second sub-layer which is made of one of silicon oxide and silicon oxynitride and such that when thermal desorption measurement is performed with respect to the second sub-layer, hydrogen is observed as desorption gas and within a temperature range of 300 degrees Celsius to 350 degrees Celsius, an average increase coefficient of the desorption gas does not take a positive value, the second sub-layer included in at least one of the channel protection layer and the passivation layer.

4. The thin film transistor device of claim 3, wherein the second sub-layer is included in the channel protection layer.

5. The thin film transistor device of claim 4, wherein the channel protection layer is made of silicon oxide, is formed at a rate between 50 nm/sec and 110 nm/sec, and has a refractive index between 1.454 and 1.461.

6. The thin film transistor device of claim 1, wherein the passivation layer includes a first layer, a second layer, and a third layer layered one on top of another with the first layer closest to the substrate,
at least one of the first layer and the third layer corresponds to the first sub-layer, and
the second layer is made of an Al compound.

7. The thin film transistor device of claim 6, wherein the second layer is made of AlOx.

8. The thin film transistor device of claim 6, wherein the passivation layer further includes a fourth layer on the third layer,
the third layer and the fourth layer are both made of silicon nitride, and
the fourth layer contains silicon nitride at a lower density than the third layer.

9. The thin film transistor device of claim 6, wherein the first layer is made of silicon oxide, and is in contact with the source electrode and the drain electrode.

10. A display device comprising:
the thin film transistor device of claim 1.

* * * * *